United States Patent
Nagahara et al.

(10) Patent No.: US 10,101,669 B2
(45) Date of Patent: Oct. 16, 2018

(54) EXPOSURE APPARATUS, RESIST PATTERN FORMING METHOD, AND STORAGE MEDIUM

(71) Applicant: Tokyo Electron Limited, Tokyo (JP)

(72) Inventors: Seiji Nagahara, Tokyo (JP); Gousuke Shiraishi, Koshi (JP); Satoru Shimura, Koshi (JP); Kousuke Yoshihara, Koshi (JP); Shinichiro Kawakami, Koshi (JP); Masaru Tomono, Koshi (JP); Yuichi Terashita, Koshi (JP); Hironori Mizoguchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 56 days.

(21) Appl. No.: 15/109,917

(22) PCT Filed: Jan. 13, 2015

(86) PCT No.: PCT/JP2015/050593
§ 371 (c)(1),
(2) Date: Jul. 6, 2016

(87) PCT Pub. No.: WO2015/108015
PCT Pub. Date: Jul. 23, 2015

(65) Prior Publication Data
US 2016/0327869 A1    Nov. 10, 2016

(30) Foreign Application Priority Data

Jan. 20, 2014    (JP) .................................. 2014-007619
Dec. 3, 2014    (JP) .................................. 2014-245308

(51) Int. Cl.
*G03F 7/20* (2006.01)

(52) U.S. Cl.
CPC .......... *G03F 7/7055* (2013.01); *G03F 7/2022* (2013.01); *G03F 7/70558* (2013.01)

(58) Field of Classification Search
CPC ............... G03F 7/70558; G03F 7/7055; G03F 7/70425; G03F 7/70433; G03F 7/7045; G03F 7/70458; G03F 7/70466
See application file for complete search history.

(56) References Cited

U.S. PATENT DOCUMENTS 5,742,362 A * 4/1998 Chikamichi .......... G03F 7/2022
                                                          349/2
6,020,107 A    2/2000 Niiyama et al.
(Continued)

FOREIGN PATENT DOCUMENTS

EP    0 507 589 A2    10/1992
EP    0 507 589 A3    10/1992
(Continued)

OTHER PUBLICATIONS

International Search Report and Written Opinion (Application No. PCT/JP2015/050593) dated Apr. 14, 2015.
(Continued)

*Primary Examiner* — Steven H Whitesell Gordon
(74) *Attorney, Agent, or Firm* — Burr & Brown, PLLC

(57) ABSTRACT

A technique which, in forming a resist pattern on a wafer, can achieve high resolution and high in-plane uniformity of pattern line width. After forming a resist film on a wafer W and subsequently performing pattern exposure by means of a pattern exposure apparatus, the entire pattern exposure area is exposed by using a flood exposure apparatus. During the flood exposure, the exposure amount is adjusted depending on the exposure position on the wafer based on information on the in-plane distribution of the line width of a resist pattern, previously obtained from an inspection apparatus. Methods for adjusting the exposure amount include a
(Continued)

method which adjusts the exposure amount while moving a strip-shaped irradiation area corresponding to the diameter of the wafer, a method which involves intermittently moving an irradiation area, corresponding to a shot area in the preceding pattern exposure, to adjust the exposure amount for each chip.

22 Claims, 18 Drawing Sheets

(56) References Cited

U.S. PATENT DOCUMENTS

| | | |
|---|---|---|
| 2001/0050761 A1 | 12/2001 | Uzawa |
| 2005/0224724 A1 | 10/2005 | Carpaij et al. |
| 2008/0085471 A1 | 4/2008 | Anderson et al. |
| 2008/0230722 A1 | 9/2008 | Elian |
| 2009/0047604 A1* | 2/2009 | Stoeldraijer ........ G03F 7/70425 430/311 |
| 2010/0266960 A1 | 10/2010 | Mashita et al. |
| 2011/0250540 A1* | 10/2011 | Huang .................. G03F 7/2022 430/296 |
| 2012/0002183 A1* | 1/2012 | Ota ..................... G03F 7/70291 355/67 |
| 2014/0347643 A1* | 11/2014 | Kotoku ............... G03F 7/70558 355/52 |

FOREIGN PATENT DOCUMENTS

| | | |
|---|---|---|
| GB | 2 155 650 A | 9/1985 |
| JP | 60-170237 A1 | 9/1985 |
| JP | 11-162844 A1 | 6/1999 |
| JP | 2000-267259 A1 | 9/2000 |
| JP | 2000-323372 A1 | 11/2000 |
| JP | 2005-303312 A1 | 10/2005 |
| JP | 2006-078744 A1 | 3/2006 |
| JP | 2010-251580 A1 | 11/2010 |
| JP | 2013-104934 A1 | 5/2013 |

OTHER PUBLICATIONS

International Preliminary Report on Patentability (PCT/JP2015/050593) dated Aug. 4, 2016.

Extended European Search Report (Application No. 15737732.6) dated Aug. 7, 2017.

* cited by examiner (MOVEMENT DIRECTION OF L3)

(A)

| 99 | 99 | 99 | 99 |
|---|---|---|---|
| 99 | 99 | 99 | 99 |
| 99 | 99 | 99 | 99 |
| 99 | 99 | 99 | 99 |

+

(B)

| 0.5 | 1.0 | 1.0 | 1.5 |
|---|---|---|---|
| 0.5 | 1.0 | 1.0 | 1.5 |
| 0.5 | 1.0 | 1.0 | 1.5 |
| 0.5 | 1.0 | 1.0 | 1.5 |

⇧

(C)

| 99.5 | 100 | 100 | 100.5 |
|---|---|---|---|
| 99.5 | 100 | 100 | 100.5 |
| 99.5 | 100 | 100 | 100.5 |
| 99.5 | 100 | 100 | 100.5 |

FIG. 21

EXPOSURE APPARATUS, RESIST PATTERN FORMING METHOD, AND STORAGE MEDIUM

TECHNICAL FIELD

The present invention relates to a technique for exposing the entire surface of a substrate after pattern exposure of the substrate.

BACKGROUND ART

A method using a chemically amplified resist is known as a method to form a resist pattern on a semiconductor wafer, a glass substrate for a liquid crystal display, or the like. When such a resist is subjected to exposure (pattern exposure) using a pattern mask, performed by means of an exposure apparatus, an acid is generated in exposed portions of the resist, and the acid diffuses upon heating of the resist, whereby the resist becomes, for example, alkali-soluble. Therefore, a pattern is formed by supplying a developer to the resist film.

As circuits are becoming increasingly finer, a high resolution is required even for a fine pattern in a resist pattern forming process. Extreme ultraviolet (EUV) exposure is known as a method that meets the requirement. EUV exposure, however, has the following problem: To increase the light intensity of an exposure light source necessitates a significant scale-up of the apparatus and thus entails a considerably increased cost. This makes an appreciable increase in the light intensity quite difficult, posing the problem of low throughput (number of substrates processed per unit time).

Patent document 1 discloses a method which involves performing a first pattern forming step by exposure of a wafer to light, using a chemically amplified resist, and then performing a second pattern exposure step by exposure of the wafer to an electron beam. However, the method disclosed in the patent document necessitates the two steps of pattern exposure and, in addition, requires heating of the wafer after each exposure step. This method thus needs improvement from the viewpoint of throughput. Patent document 2 discloses a resist composition for forming a resist pattern by EUV exposure and a method for forming a resist pattern. This document, however, addresses the resist composition itself, and is directed to a technical problem significantly different from that of the present invention.

PRIOR ART DOCUMENTS

Patent Documents

Patent document 1: Japanese Patent Laid-Open Publication No. H11-162844
Patent document 2: Japanese Patent Laid-Open Publication No. 2006-78744

SUMMARY OF THE INVENTION

Problems to be Solved by the Invention

The present invention has been made against this background. It is therefore an object of the present invention to provide a technique which can form a resist pattern with high resolution and with high uniformity in a substrate surface by exposing a pattern exposure area of the substrate after performing pattern exposure of a resist film.

Means for Solving the Problems

The present invention, in one aspect, provides an exposure apparatus for exposing a pattern exposure area after performing pattern exposure on a substrate having a resist film formed thereon by using a pattern mask, said apparatus comprising: a stage for placing the substrate thereon; an exposure section for exposing the substrate on the stage; and a controller for outputting, based on previously-obtained information, a control signal to adjust an exposure amount for each of a plurality of areas of the substrate.

The present invention, in another aspect, provides an exposure apparatus for exposing a pattern exposure area after performing pattern exposure on a substrate having a resist film formed thereon by using a pattern mask, said apparatus comprising: a first exposure unit including a first stage for placing the substrate thereon, and a first exposure section for exposing the entire pattern exposure area of the substrate on the first stage; and a second exposure unit including a second stage for placing the substrate thereon, a second exposure section for exposing a plurality of areas of the substrate on the second stage, and a controller for outputting, based on previously-obtained information, a control signal to adjust the exposure amount of the second exposure section for each of the plurality of areas of the substrate.

The present invention, in yet another aspect, provides a resist pattern forming method comprising the steps of: performing pattern exposure of a resist film, which has been formed on a substrate using a resist by using a pattern mask; determining an exposure amount for each of a plurality of areas of the substrate based on previously-obtained information; subsequently exposing a pattern exposure area of the substrate based on the exposure amount determined in the preceding step; subsequently heating the substrate; and subsequently developing the substrate.

The present invention, in yet another aspect, provides a resist pattern forming method comprising: a pattern exposure step of performing pattern exposure of a resist film, which has been formed on a substrate using a resist, by using a pattern mask; a first exposure step of exposing the entire pattern exposure area of the substrate that has been exposed in the pattern exposure step; a step of determining, based on previously-obtained information, an exposure amount for each of a plurality of areas in the pattern area of the substrate that has been exposed in the pattern exposure step; a second exposure step of exposing the plurality of areas of the substrate based on the exposure amount determined in the preceding step; a step of subsequently heating the substrate; and a step of subsequently developing the substrate.

The present invention, in yet another aspect, provides a storage medium storing a computer program for use in an apparatus for exposing a substrate, having a resist film formed thereon, after pattern exposure of the substrate, said computer program including steps for causing the apparatus to perform any one of the above resist pattern forming methods.

Advantageous Effects of the Invention

According to the present invention, in performing exposure of a substrate after pattern exposure, the exposure amount is adjusted depending on the position on the substrate based on information that has an influence on the in-plane distribution of the line width of a resist pattern (in a broad sense including, beside the line width of a line pattern, the hole diameter of a hole pattern, etc.). This makes it possible to form a resist pattern on the substrate with high in-plane uniformity.

According to an embodiment of the present invention, in performing exposure of a substrate after pattern exposure, the exposure process is divided into the first exposure step of exposing the entire surface of the substrate and the second exposure step of exposing a plurality of areas of the substrate. The adjustment of the exposure amount in the surface of the substrate based on previously-obtained information is performed by the second exposure step. This facilitates the adjustment of the exposure amount.

BRIEF DESCRIPTION OF THE DRAWINGS

FIG. 21 is a diagram illustrating high-illuminance exposure and low-illuminance exposure in the fourth embodiment of the present invention;

DETAILED DESCRIPTION OF THE INVENTION

First Embodiment

Figure 1:
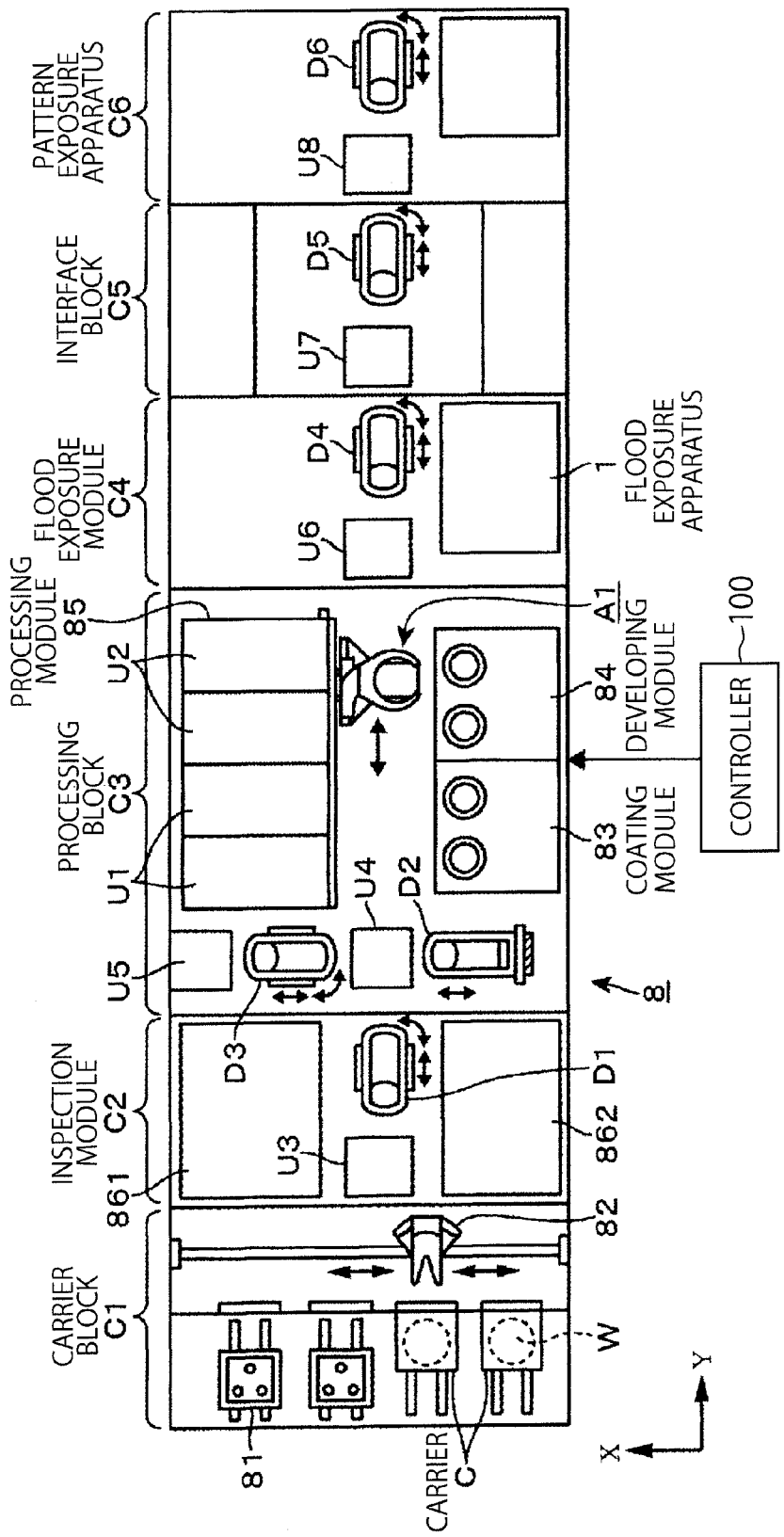
FIG. 1 is a plan view of a system including a coating/developing apparatus according to a first embodiment of the present invention and a pattern exposure apparatus connected to the apparatus.
Figure 2:
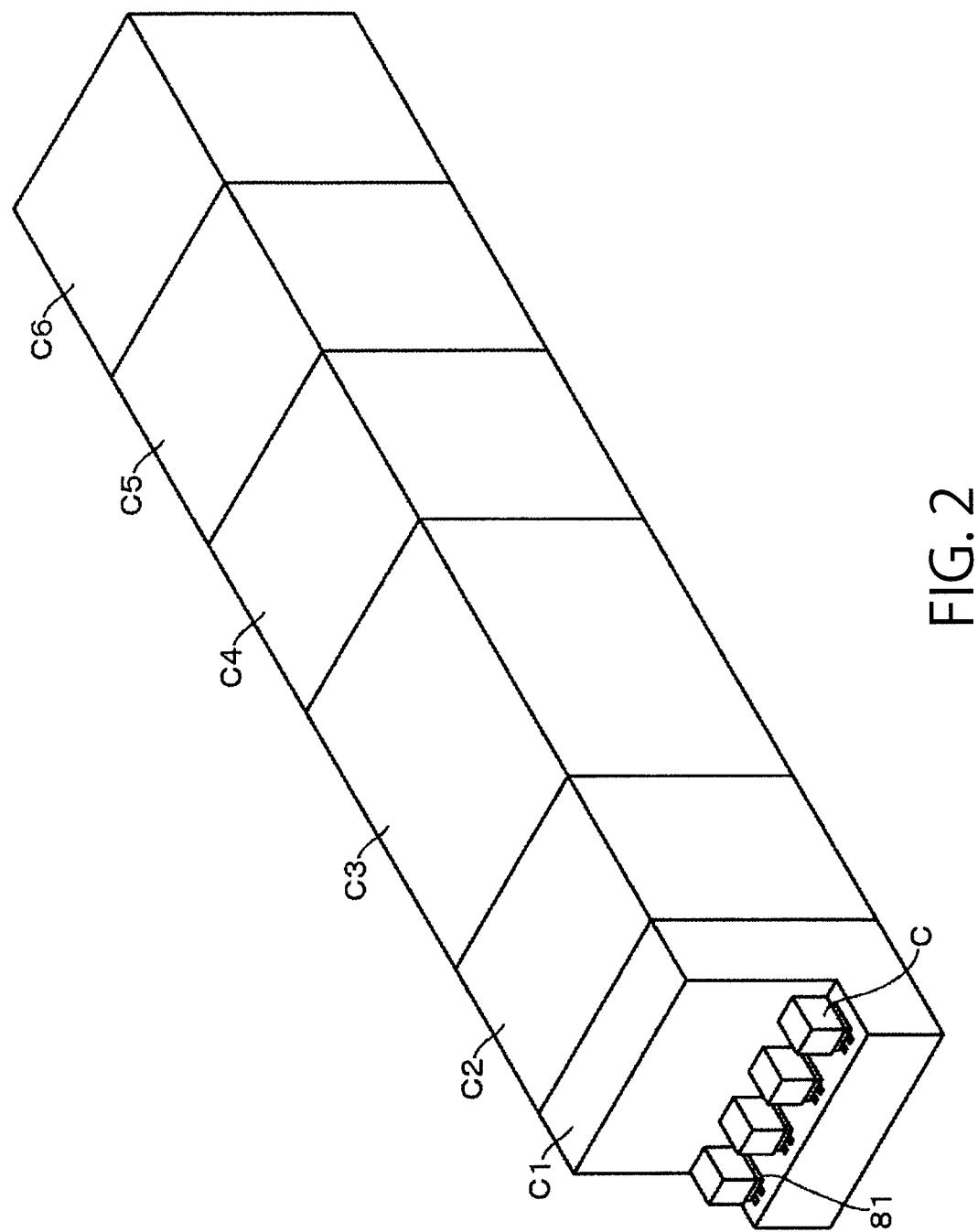
FIG. 2 is a perspective view of the system.

The construction of a coating/developing apparatus 8 including an exposure apparatus according to an embodiment of the present invention will now be described with reference to FIGS. 1 and 2. FIG. 1 is a plan view of a system including the coating/developing apparatus 8 and a pattern exposure apparatus C6 connected to the apparatus 8; and FIG. 2 is a perspective view of the system. The coating/developing apparatus 8 is provided with a carrier block C1. A wafer W, housed in a sealed carrier C placed on a stage 81, is taken out by a transfer arm 82. The transfer arm 82 functions to transfer a wafer W after development to an inspection module C2, and to receive a wafer W after inspection from the inspection module C2 and return the wafer W to the carrier C. The inspection module C2 is a module to inspect the line width of a pattern formed on a processed wafer W, as described below.

A wafer W, which has been transported to the inspection module C2, is once placed on a transfer stage U3, and is then transported by a transport arm D1 onto a transfer stage U4 in a processing block C3 connected to the posterior side of the inspection module C2. Besides the transfer stage U4, the processing block C3 includes a shelf unit U5, a coating module 83 for applying a resist solution to a wafer W as will be described in detail below, and a developing module 84 for performing development of a wafer W after exposure. The processing block C3 also includes units U1, U2 consisting of a stack of processing modules 85 for performing heat treatment, etc. of a wafer W, and a transport arm A1, a transport arm D2 and a transport arm D3. The transport arm A1 functions to transport a wafer W between the transfer stage U4 and each module. The transport arm D2 functions to transport a wafer W between it and the transfer stage U4. The transport arm D3 functions to transport a wafer W between the transfer stage U4 and the shelf unit U5.

A wafer W, which has undergone coating with the resist solution, is transported onto a transfer stage U6 in a flood exposure module C4 which is a module for performing the below-described flood exposure. Subsequently, the wafer W is transported by a transport arm D4 in the flood exposure module C4 onto a transfer stage U7 in an interface block C5. The wafer W on the transfer stage U7 is transported by a transport arm D5 onto a transfer stage U8 in a posterior pattern exposure apparatus C6, and is then subjected to pattern exposure using e.g. EUV light. A transport arm D6 functions to transport a wafer W in the pattern exposure apparatus C6.

The wafer W after the pattern exposure is again transported into the interface block C5, and then returned to the flood exposure module C4. After the temperature of the wafer W is adjusted by means of a not-shown cooling plate, the below-described flood exposure is performed on the wafer W in a flood exposure apparatus 1 in the flood exposure module C4. The cooling plate is, for example, superimposed on the transfer stage U6 in the flood exposure module C4. The wafer W after the flood exposure is returned to the processing block C3, and is subjected to PEB (post-exposure bake) heat treatment in a heating module in the units U1, U2. The wafer W after PEB is transported into the developing module 84, where the wafer W is subjected to pattern development with a developer. The wafer W after the development is returned to the inspection module C2 via the transfer stage U4.

In the inspection module C2, the wafer W is subjected to inspection of pattern line width in an inspection apparatus 861 (862). More specifically, the line width of a pattern formed on the wafer W is detected, and data on the pattern line widths and the corresponding positions on the wafer W is stored as pattern information in a storage unit in the inspection apparatus 861 (862). The wafer W after the inspection is transferred onto the transfer stage U3, and then returned to the carrier C by the transfer arm 82 of the carrier block C1.

A resist for use in this embodiment will now be described. The resist is a so-called photosensitive chemically amplified resist. When the resist is irradiated with light having a wavelength usable for pattern exposure, such as EUV light or EB (electron beam), an acid and a photosensitizer are generated in the resist. In the subsequent flood exposure performed in the below-described manner, light is employed having such a selected wavelength that only the photosensitizer generated absorbs the light; therefore, an acid and a photosensitizer are generated again only in those portions which have undergone the pattern exposure. Thus, the flood exposure increases the acid only in the pattern portion formed by the pattern exposure. In the later PEB treatment, a catalytic reaction between the polymers of the resist and the acid occurs in the pattern portion, whereby the resist becomes soluble in a developer.

The flood (whole-surface) exposure apparatus 1 of the present invention will now be described.

Figure 3:
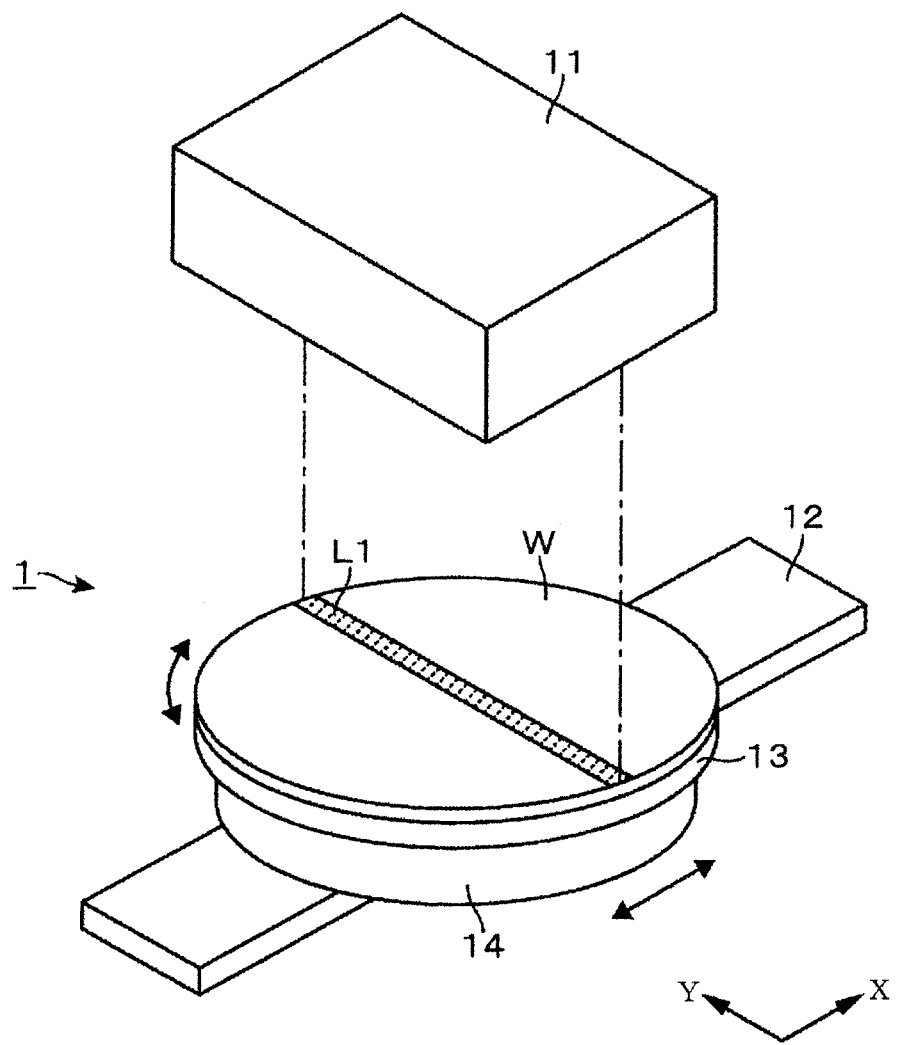
FIG. 3 is a schematic perspective view of a flood exposure apparatus according to the first embodiment of the present invention.

As shown in FIG. 3, the flood exposure apparatus 1 includes a stage 13 as a wafer stage which is supported by a stage support 14 and which can rotate with respect to the stage support 14. The stage support 14 is configured to be movable in an X-direction by an X movement mechanism 12 comprised of, for example, a combination of a ball screw and a motor. An exposure section 11 is provided above the stage 13. The stage 13 and the exposure section 11 are disposed in a chassis (not shown) for separating them from the outside of the flood exposure apparatus 1. In FIG. 3, L1 represents an irradiation area (exposure area) being irradiated with light from the exposure section 11 as will be described below.

Figure 4:
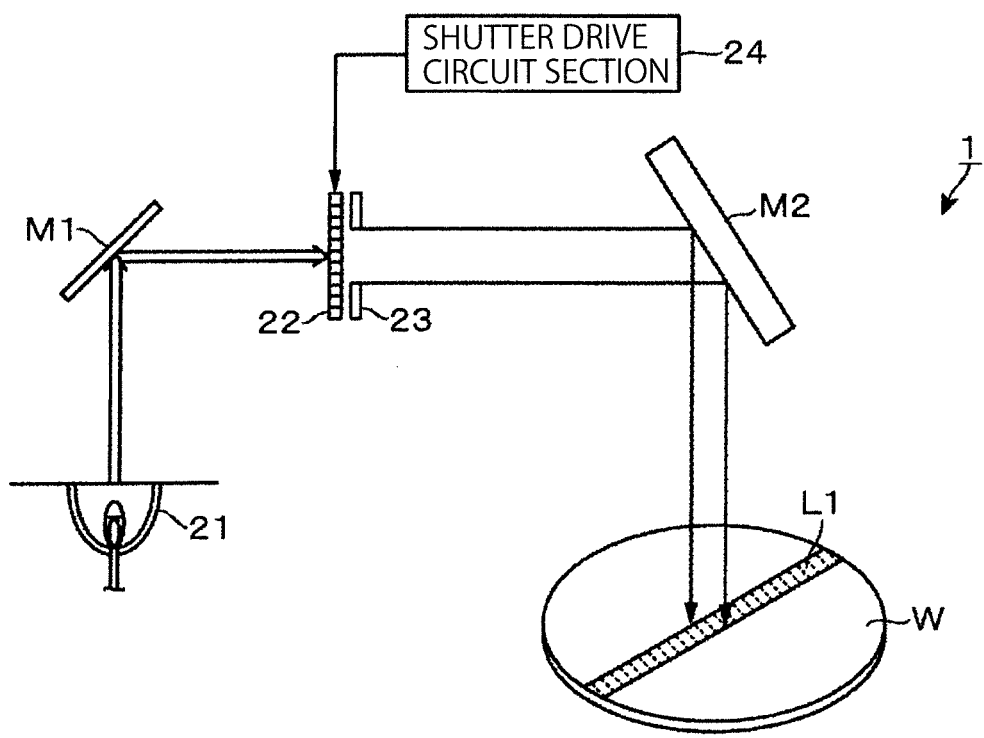
FIG. 4 is a diagram illustrating irradiation of a wafer with light emitted from a light source in the flood exposure apparatus.

As shown in FIG. 4, the exposure section 11 includes a light source 21 comprised of e.g. a Xe—Hg lamp, and light path members. In FIG. 3, the exposure section 11 is shown by the case in which the light source 21, the light path members, etc. are housed. The light path members are comprised of a reflecting mirror M1, an LCD (liquid crystal display) shutter 22 which is a transmission filter, a mask 23, a reflecting mirror M2, etc. Though not shown diagrammatically, the light path members also include a lens, etc. Light from the light source 21 is reflected by the reflecting mirror M1 so that the reflected light enters the LCD shutter 22, and the transmitted light from the LCD shutter 22 passes through the mask 23.

Figure 5:
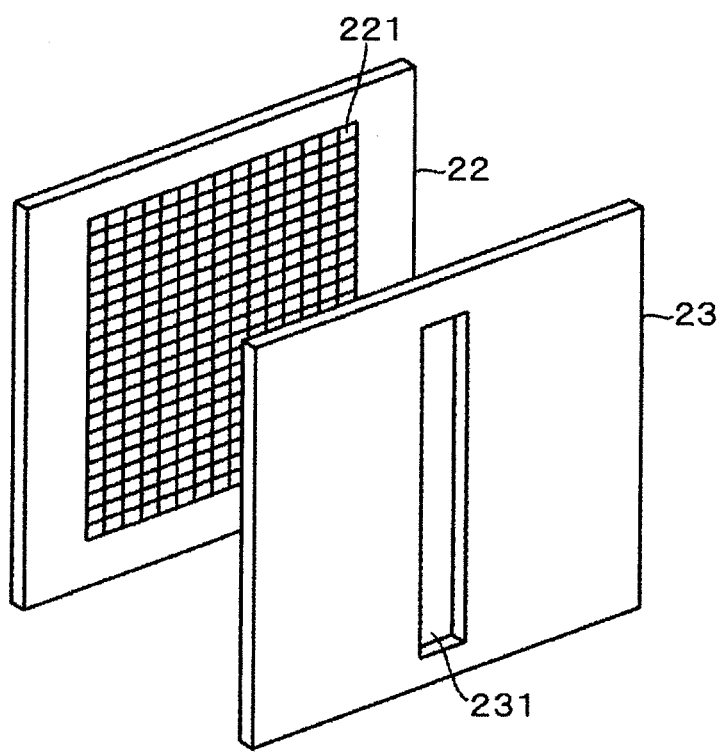
FIG. 5 is a perspective view of an LCD shutter and a mask provided in the flood exposure apparatus.

The mask 23 is to regulate the irradiation area of a wafer W and, as shown in FIG. 5, has an opening 231 having a length (e.g. 300 mm) corresponding to the diameter of the wafer W and a predetermined width, for example, 1 mm. The width of the opening 231 may correspond to the size of each of those chips which are to be formed on the wafer W. The light that has passed through the mask 23 reaches the wafer W via the reflecting mirror M2, and forms the strip-shaped irradiation area L1 as shown in FIGS. 3 and 4.

As shown in FIG. 5, the LCD shutter 22 has a number of shutter portions 221 arranged in a matrix pattern on a glass substrate. Each shutter portion 221 is provided with a transistor for making the shutter portion 221 in a light transmissive state or in a light blocking state. The LCD shutter 22 serves as a light control plate. The shutter drive circuit section 24 shown in FIG. 4 is a circuit section for controlling on/off of each transistor.

On the other hand, the wafer (imaginary wafer) W is divided into a plurality of areas in a matrix pattern in the memory space of a memory 104 (see FIG. 6) in the below-described controller 100. When the area of each shutter portion 221 is called a pixel, an area in the pixels of the LCD shutter 22, corresponding to each divided area of the wafer W, contains a plurality of pixels. Therefore, the exposure amount for each divided area of the wafer W, i.e. the amount of light that irradiates each divided area, can be adjusted by adjusting, in that area of the LCD shutter 22 which is not covered by the mask, the number of "on" pixels of the plurality of pixels which correspond to the divided area of the wafer W. Thus, in other words, the light emission pattern of the exposure section 11 can be adjusted, and the illuminance pattern of the irradiation area L1 on the wafer W can be adjusted.

The term "on" pixel refers to a pixel which has been made light transmissive by turning on the transistor. Information as to which pixels of all the pixels are to be made "on" pixels is possessed by the below-described controller 100. In this embodiment the LCD shutter 22 and the shutter drive circuit section 24 constitute an exposure amount adjustment section for adjusting the exposure amount for the wafer W.

Figure 6:
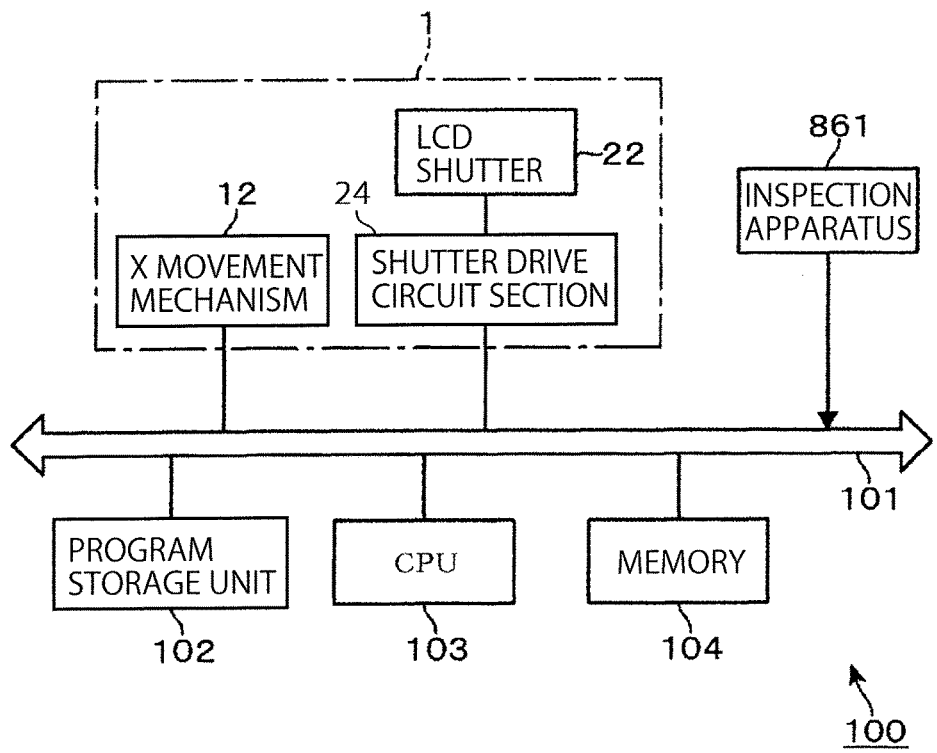
FIG. 6 is a diagram illustrating a control mechanism in the flood exposure apparatus.

As shown in FIG. 6, the coating/developing apparatus 8 includes a controller 100. FIG. 6 illustrates those parts of the controller 100 which are related to the flood exposure apparatus 1 and the inspection apparatus 861; the controller 100 includes a bus 101, a program storage unit 102, a CPU 103, and a memory (memory unit) 104. A program in the program storage unit 102 includes steps for generating, based on the pattern information on the pattern line widths and the corresponding positions on the wafer W, sent from the inspection apparatus 861 (862), data for controlling the exposure amount adjustment section, and storing the data in the memory 104. The pattern information has an influence on the in-plane distribution of the line widths of a resist pattern obtained from a resist film.

As described previously, the wafer (imaginary wafer) W is divided into a plurality of areas in a matrix pattern in the memory space. The positions on the wafer W, correlated with the pattern line widths and contained in the pattern information sent from the inspection apparatus 861 (862), are at a narrower level than the divided areas of the wafer W, correlated with the exposure amounts. Therefore, an average line width value is determined for each divided area from the line width values of the pattern information, contained in the divided area, and the average value is treated (evaluated) as the line width of the divided area. Assuming that the pattern line width is the width of the insoluble portion of a resist pattern using e.g. a positive resist, the line width is narrow at a large exposure amount and wide at a small exposure amount. In this case, therefore, in order to equalize the line width among the divided areas, the exposure amount should be increased for a divided area where the line width is wider than a desired line width, whereas the exposure amount should be decreased for a divided area where the line width is narrower than the desired line width.

From this viewpoint, multi-level, e.g. four-level for convenience, exposure amounts are assigned and normalized depending on the line widths of the divided areas, and data on a correlation between the positions of the divided areas and the assigned normalized exposure amount values is stored in the memory 104. The data processing is performed by the program. As described previously, in this embodiment the exposure amount of light that irradiates each divided area of the wafer W is determined by on/off of the pixels of the LCD shutter 22. A normalized exposure amount value is, for example, the addresses of transistors which are to be turned on in those areas of the LCD shutter 22 which correspond to each divided area of the wafer W.

Assuming that a divided area contains four transistors Tr1 to Tr4, and that there are first-step to fourth-step normalized exposure amount values, the transistor Tr1 may be turned on at the first-step exposure amount; the transistors Tr1 and Tr2 may be turned on at the second-step exposure amount; the transistors Tr1 to Tr3 may be turned on at the third-step exposure amount; and all the transistors Tr1 to Tr4 may be turned on at the fourth-step exposure amount. A control signal which is sent from the controller 100 to the shutter drive circuit section 24 can be exemplified by an on/off command directed to switching elements for the word lines of the transistors constituting the pixels, and to switching elements for the bit lines of the transistors.

The exposure amount may be adjusted also by adjusting the duty ratio (ratio between off-time and on-time) in on/off of the pixels of the LCD shutter 22.

Of the planar coordinates that identify the position of each divided area of the wafer W, the X-coordinate is controlled by the drive system of the X movement mechanism 12. When the X movement mechanism 12 is comprised of e.g. a ball screw mechanism, the X-coordinate is determined by an encoder connected to a motor. The X-coordinate changes as the elongated irradiation area L1 on the wafer W moves. Accordingly, by storing information on transistors to be turned on, contained in the area of the LCD shutter 22 corresponding to the opening 231 of the mask, for each X-coordinate interval which is equal to an X-direction side of each divided area, an irradiation pattern for the irradiation area L1 can be determined based on information retrieved from the memory unit every time the irradiation area L1 passes the boundary between divided areas arranged in the X-direction.

In this embodiment the width of the strip-shaped irradiation area L1 is set at a value smaller than the length of an X-direction side of each divided area.

The method of adjusting the exposure amounts of various portions of the wafer W by thus allowing the irradiation area L1 to continuously scan wafer W is preferred when the line width of a pattern on the wafer W changes in the X-direction continuously or stepwise over the diameter of the wafer W or in part of the diameter. Examples of such a case may include the case where the pattern line width of the wafer W placed on the stage 13 is constant in the Y-direction, whereas the pattern line width gradually increases in the X-direction, and the case where there is a distribution in the pattern line width in the X-direction e.g. at approximately three levels. In such cases, a method can be used which involves setting the same exposure amount for the entire irradiation area L1, and changing the set value of the exposure amount depending on the X-coordinate position of the irradiation area L1.

When the pattern line width is not constant in the Y-direction, the exposure amount in the Y-direction may be appropriately adjusted by forming an appropriate light emission pattern in the above-described manner. In this case, the Y-direction illuminance pattern is adjusted depending on the X-coordinate position of the irradiation area L1. As a result, the exposure amount is adjusted depending on the X-direction and Y-direction positions on the wafer W. This enables fine adjustment of the exposure amount, thereby contributing to further enhancement of the in-plane uniformity of the line width of a resist pattern.

In the case where the Y-direction exposure amount is constant or in the case where the Y-direction exposure amount is not constant, and a mountain-valley distribution pattern exists in the Y-direction exposure amount, it is possible to allow the irradiation area L1 to scan the wafer W while fixing the exposure amount distribution (illuminance pattern), i.e. without changing the illuminance pattern depending on the X-coordinate position of the irradiation area L1. Also in such an embodiment, the exposure amount is adjusted depending on the position on the wafer W.

A program in the program storage unit 102 includes a command (steps) to send control signals from the controller 100 to components of the coating/developing apparatus 8 so as to perform the below-described coating/developing process. The program is stored in a computer storage medium such as a flexible disk, a compact disk, a hard disk, an MO (magneto-optical disk), etc., and installed on the controller 100.

The operation of the coating/developing apparatus 8 will now be described.

Before starting processing of wafers as products (product wafers) in the coating/developing apparatus, a pattern is formed on a test wafer by, for example, using the same resist and the same pattern exposure mask as those to be used for the product wafers. Subsequently, flood exposure is performed on the test wafer in the same manner as for the product wafers except for using a reference exposure amount for the test wafer in the flood exposure apparatus 1, followed by development of the test wafer. By "flood exposure is performed on the test wafer in the same manner as for the product wafers" is meant that the size of the irradiation area L1 with respect to the test wafer, and the scan direction and the scan speed of the irradiation area L1 with respect to the test wafer are the same as for the product wafers.

A pattern formed on the test wafer is inspected by the inspection apparatus 861 (862) to acquire pattern information on the pattern line widths and the corresponding positions on the wafer W. The controller 100 receives the pattern information e.g. online, and generates data (data for exposure amount adjustment) on a correlation between positions on the wafer W, e.g. the positions of divided areas, and normalized exposure amount values (parameter values corresponding to exposure amounts). Wafers in a lot are sequentially subjected to resist coating and subsequent pattern exposure in the pattern exposure apparatus C6 as described above with reference to FIGS. 1 and 2. After performing the above-described temperature adjustment on a wafer W after the pattern exposure, the wafer W is transported into the flood exposure apparatus 1, where flood exposure is performed on the wafer W.

The operation of the flood exposure apparatus 1 will now be described with reference to FIG. 7. First, the position of the wafer W is adjusted by means of the X movement mechanism 12 so that the irradiation area L1 being irradiated with light from the exposure section 11 comes to lie at one end of the wafer W. The irradiation area L1 is a strip-shaped area that entirely covers the diameter of the wafer W and extends in the Y-direction. Thereafter, while keeping the irradiation area L1 formed on the wafer W, the wafer W is moved at a constant speed in the X-direction by the X movement mechanism 12, thereby allowing the irradiation area L1 to scan the wafer surface to the other end of the wafer W. The CPU 103 is caused by the program to retrieve from the memory 104 an exposure amount value, e.g. the above-described normalized exposure amount value, depending on the Y-direction position on the wafer W, and output a control signal to the shutter drive circuit section 24. As described previously, the wafer W is divided into a plurality of areas in a matrix pattern in the memory space. Of the shutter portions (pixels) of the LCD shutter 22 which are contained in a divided area, a particular number of shutter portions, corresponding to the exposure amount value of the divided area, become light transmissive areas. In this manner, the light emission amount of the exposure section 11, and thus the exposure amount, can be adjusted depending on the Y-direction position on the wafer W.

In a specific example, the line width of the pattern (insoluble portion) of the test wafer gradually decreases from one end, which is determined using a notch of the wafer as a reference, to the other end of the wafer (from one end to the other end in the Y-direction of the flood exposure apparatus 1). In this case, the exposure amount of the irradiation area of the product wafer W is adjusted in such a manner that it gradually decreases from the corresponding one end to the other end of the wafer W.

The scan of the wafer W with the irradiation area L1 may be performed once. Alternatively, in order to reduce the influence of deflection of light for exposure, it is possible to rotate the stage 13 through 180 degrees after performing first exposure, and then allow the irradiation area L1 to again scan the wafer W from one end to the other end. The exposure of the wafer W from one end to the other end and the 180-degree rotation of the wafer W by the rotation of the stage 13 may be repeated multiple times.

The wafer W after the pattern exposure and the flood exposure is transported into a PEB unit, e.g. constituting the unit U1, in the processing block C3. PEB processing of the wafer W is performed in the PEB unit, whereby those portions of the resist film which have undergone pattern exposure become soluble in a developer. Thereafter, the wafer W is transported into the developing module 84, where development of the resist with the developer is performed to form a resist pattern.

In the above-described embodiment, pattern exposure of a wafer W, coated with a photosensitive chemically amplified resist, is performed to generate an acid and a photosensitizer in the resist, and subsequently the whole-surface exposure (flood exposure) of the wafer W is performed using light having a longer wavelength than light used in the pattern exposure, thereby further generating an acid from the photosensitizer. This method makes it possible to form a resist pattern with high line width accuracy at a small exposure amount, thereby avoiding a low throughput.

Further, in the above-described embodiment, after processing a test wafer in the same manner as for a product wafer, the test wafer is subjected to flood exposure at a reference exposure amount in the flood exposure apparatus 1, followed by heat treatment and development. The line width of the resulting resist pattern is inspected by the inspection apparatus and, based on the line width information, the exposure amount during flood exposure of a product wafer W is adjusted depending on the position on the wafer W. Thus, the generation of an acid during the flood exposure of the wafer W is appropriately controlled depending on the point on the surface of the wafer W. The pattern line width can therefore be adjusted over the entire surface of the wafer W.

Though in the above-described embodiment pattern information on a resist pattern is acquired using a test wafer, it is also possible to use pattern information, obtained by the inspection apparatus, on a resist pattern formed on a preceding wafer in the same lot. Alternatively, it is possible to inspect a wafer by means of a stand-alone inspection apparatus provided outside the coating/developing apparatus, input offline the acquired pattern information into the controller 100, and generate data for exposure amount adjustment based on the pattern information.

Previously-acquired information which serves as a basis for generating data for exposure amount adjustment is not limited to pattern information, and may be information that has an influence on the in-plane distribution of the line width of a resist pattern, such as information on the characteristics of the pattern exposure apparatus C6 or information on the characteristics of a heating unit for performing PEB.

Instead of using, as a method for forming the irradiation area L1, the method of regulating the light transmission area by means of the mask 23, it is possible to use a method which involves turning off shutter portions 221 (pixel portions) around that area of the LCD shutter 22 which corresponds to the opening 231 of the mask 23, thereby regulating the light transmission area.

In the flood exposure apparatus 1 of this embodiment, it is possible to use a MEMS (microelectromechanical system) shutter instead of the LCD shutter 22, and to control the amount of light by opening/closing at a high speed a micro-shutter provided for each pixel in the MEMS shutter.

Figure 8:
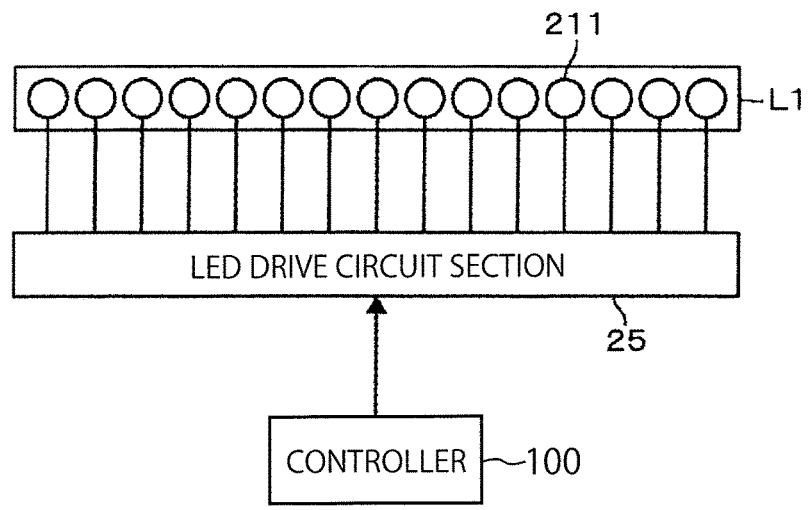
FIG. 8 is a diagram illustrating a control mechanism for a light source in the flood exposure apparatus in the case where LEDs are used for the light source.

In order to form the strip-shaped irradiation area L1 and adjust exposure amounts at various points on a wafer W, it is possible to use light emitting diodes (LEDs) 211 as the light source 21 instead of the Xe—Hg lamp in the above-described embodiment, and form an elongated irradiation area L1 as shown in FIG. 8. In one example, the LEDs 211 are arranged in a line such that the length of the irradiation area L1 is equal to the diameter of a wafer W. With respect to data to be store in the memory 104, the emission intensities of all the LEDs 211 that form the irradiation area L1 may be set e.g. at the same value, and the set value for the LEDs 211 may be changed according to the X-coordinate value of the position on the wafer W. Part or all of the LEDs 211 may be set to have different emission intensities.

The emission intensity of each LED 211 can be changed by changing the value of drive current for the LED 211. The on/off duty ratio of a switching element provided in an LED drive circuit section 25 may be used as data on emission intensity set values to be stored in the memory 104. The adjustment of the emission intensity of the LEDs 211 may be performed in combination with the above-described adjustment of the exposure amount using the shutter portions 221.

Instead of adjusting the emission intensity on the side of the exposure section 11, the adjustment of the exposure amount depending on the position on a wafer W in the flood exposure apparatus 1 may be performed by adjusting the relative speed between the irradiation area L1 and the wafer W depending on the position on the wafer W, thereby adjusting the irradiation time depending on the position on the wafer W. The adjustment of the relative speed may be performed in combination with the adjustment of the emission intensity.

The length of the strip-shaped irradiation area L1 is not limited to a length that entirely covers the diameter of a wafer W, and may be, for example, a length which is equal to the radius of the wafer W. In that case, flood exposure may be performed by first scanning one half of the wafer surface with the irradiation area L1, and subsequently scanning the remaining half of the wafer surface.

Second Embodiment

A flood exposure apparatus 1 according to a second embodiment will now be described with reference to FIGS. 9 and 10. In the following description, the same reference numerals as used for the first embodiment are used to refer to the same components, and a detailed description thereof is omitted.

First, a wafer W on which a pattern has been formed in the pattern exposure apparatus C6 is transported into the flood exposure apparatus 1. Subsequently, a strip-shaped irradiation area L1, having a length which is equal to or a slightly longer than the diameter of the wafer W, is formed by means of the exposure section 11 in the same manner as in the first embodiment. While allowing the irradiation area L1 to lie along the diameter of the wafer W, a rotating mechanism 15 connected to the stage 13 supporting the wafer W is rotated to rotate the wafer W through, for example, 180 degrees or the integral multiple of 180 degrees, thereby allowing the irradiation area L1 to scan the entire surface of the wafer W.

In the memory space of the controller 100, the wafer (imaginary wafer) W is circumferentially divided into a plurality of fan-shaped areas, for example, 360 fan-shaped areas each having a vertex angle of 1 degrees, ranging from 0 degrees to 360 degrees with a diameter passing through the center O of the wafer W as a reference line. The controller 100 determines a light amount value for each of the 360 divided areas (angular areas) based on pattern information. In one example, the controller 100 generates data for light amount adjustment in which a normalized light amount value (the number of "on" pixels contained in each divided area) is set for each divided area as described above with reference to the first embodiment.

During the rotation of the wafer W, the exposure section 11 adjusts the amount of light at varying rotational positions of the wafer W based on the data. During the rotation of the wafer W, a central portion of the irradiation area L1 continuously lies on a central area, containing the center O, of the wafer W. Therefore, the amount of light is set lower for the central area than for the outer area of the wafer W. If the amount of luminescence is uniform over the entire irradiation area L1, the exposure amount should necessarily be larger in the central area of the wafer W than in the outer area. Therefore, the difference in the exposure amount is corrected by using different amounts of luminescence for the two areas.

Figure 11:
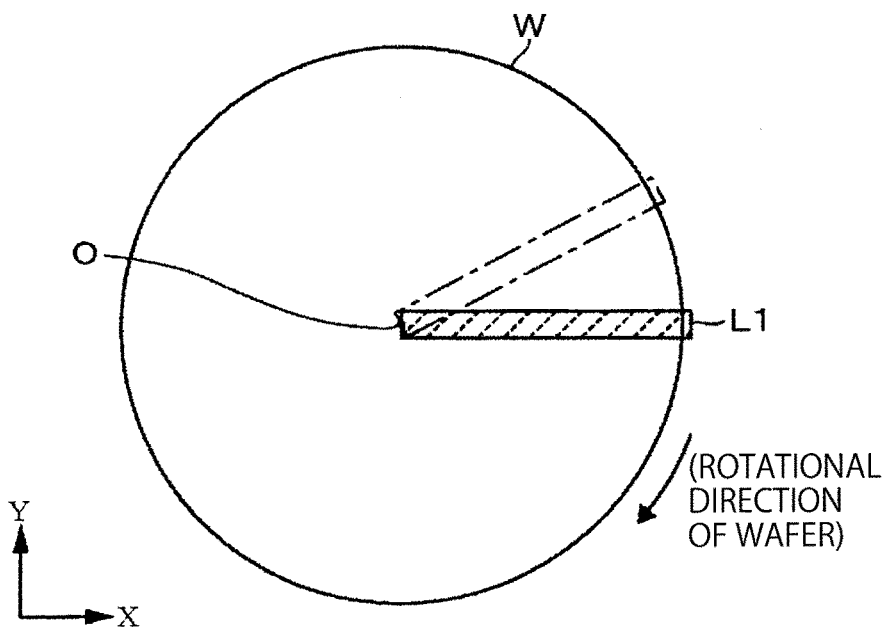
FIG. 11 is a diagram illustrating movement of an irradiation area in a flood exposure apparatus according to a variation of the second embodiment.

In this embodiment the irradiation area L1 may have a length which is slightly longer than the radius of the wafer W as shown in FIG. 11. In this case, while allowing the irradiation area L1 to lie on the radius of the wafer W, the wafer W is rotated through 360 degrees or the integral multiple of 360 degrees, thereby allowing the irradiation area L1 to scan the entire surface of the wafer W. During the 360-degree rotation of the wafer W, one end of the irradiation area L1 continuously lies on a central area, containing the center O, of the wafer W. Therefore, the amount of light is set lower for the central area than for the outer area of the wafer W.

In another example, the length of the irradiation area L1 is set a little shorter than the radius of a wafer W. While allowing the irradiation area L1 to lie on the radius of the wafer W, but with the inner end of the irradiation area L1 lying at a position away from the center O of the wafer W, the irradiation area L1 is rotated 360 degrees with respect to the wafer W. Subsequently, the irradiation area L1 is moved a short distance in the radial direction of the wafer W so that the inner end of the irradiation area L1 comes to lie on the center O of the wafer W, and exposure of a central area containing the center O is performed. During the exposure of the central area of the wafer W, the exposure amount may be kept zero in the outer area. Such a method can be performed by using a movement mechanism (e.g. the X movement mechanism 12 shown in FIG. 3) for moving a wafer W in the radial direction as shown in FIG. 3.

According to the present invention, the irradiation area L1 may thus be set larger than a mask size used in one exposure operation in a pattern exposure process, and a combination of rotation and linear movement may be employed as a relative movement of the irradiation area L1. For example, it is possible to use a method which uses a strip-shaped irradiation area L1 having a length corresponding to the diameter of a wafer W as shown in FIG. 9, and which comprises moving the irradiation area L1 in a radial direction of the wafer W e.g. by the X movement mechanism 12, and subsequently relatively rotating the irradiation area L1 about the center of the wafer W. The operation of relatively rotating the irradiation area L1 can be performed by rotating the wafer W on its center axis. In this method, the movement of the irradiation area L1 in a radial direction of the wafer W may be performed, for example, in such a manner that the irradiation area L1 scan the entire surface of the wafer W.

It is also possible to use a method which uses a strip-shaped irradiation area L1 having a length slightly longer than the radius of a wafer W, and which comprises rotating the wafer W 360 degrees while allowing the irradiation area L1 to lie on the radius of the wafer W. During the rotation of the wafer W, the exposure amount may be made zero in an inner-end portion of the irradiation area L1, lying on a central portion of the wafer W containing the center O. In this case, exposure of the wafer surface in the inner-end portion of the irradiation area L1 is later performed while making the exposure amount zero in the other area of the irradiation area L1.

In the case where the irradiation area L1 is rotated, the exposure amount of the irradiation area L1 may be adjusted (varied) uniformly depending on the position of the irradiation area L1 in the circumferential direction of the wafer W (i.e. on the circumferentially-divided area of the wafer W). Instead of the uniform adjustment of the exposure amount of the irradiation area L1, it is possible to adjust the illuminance pattern of the irradiation area L1 in the longitudinal direction.

Further, it is also possible to use a method which uses a strip-shaped irradiation area L1 having a length longer than the diameter of a wafer W, and which comprises rotating the wafer W while allowing the irradiation area L1 to continually lie on the diameter of the wafer W and moving the irradiation area L1 in the diametrical direction of the wafer W. This method can reduce the influence of deflection of light from the exposure section 11.

Also in this embodiment, as in the first embodiment, the light emission pattern may be adjusted by using the LCD shutter 22 or a MEMS shutter. Further, it is also possible to use LEDs as the light source 21 as shown in FIG. 8, and adjust the light emission pattern by adjusting the amount of luminescence for each LED.

Instead of using the mask 23, it is possible to turn off pixels of the LCD shutter 22, other than those pixels which correspond to the opening 231 of the mask 23, when forming the irradiation area L1.

In addition, instead of moving a wafer W, it is possible to move the exposure section 11, or to move both a wafer W and the exposure section 11.

Third Embodiment

In the first embodiment and the second embodiment, while exposing a wafer W with the strip-shaped irradiation area L1, the irradiation area L1 is continuously moved relative to the wafer W. In the third embodiment, on the other hand, flood exposure is performed in a stepwise manner like pattern exposure performed in the pattern exposure apparatus C6.

Figure 12:
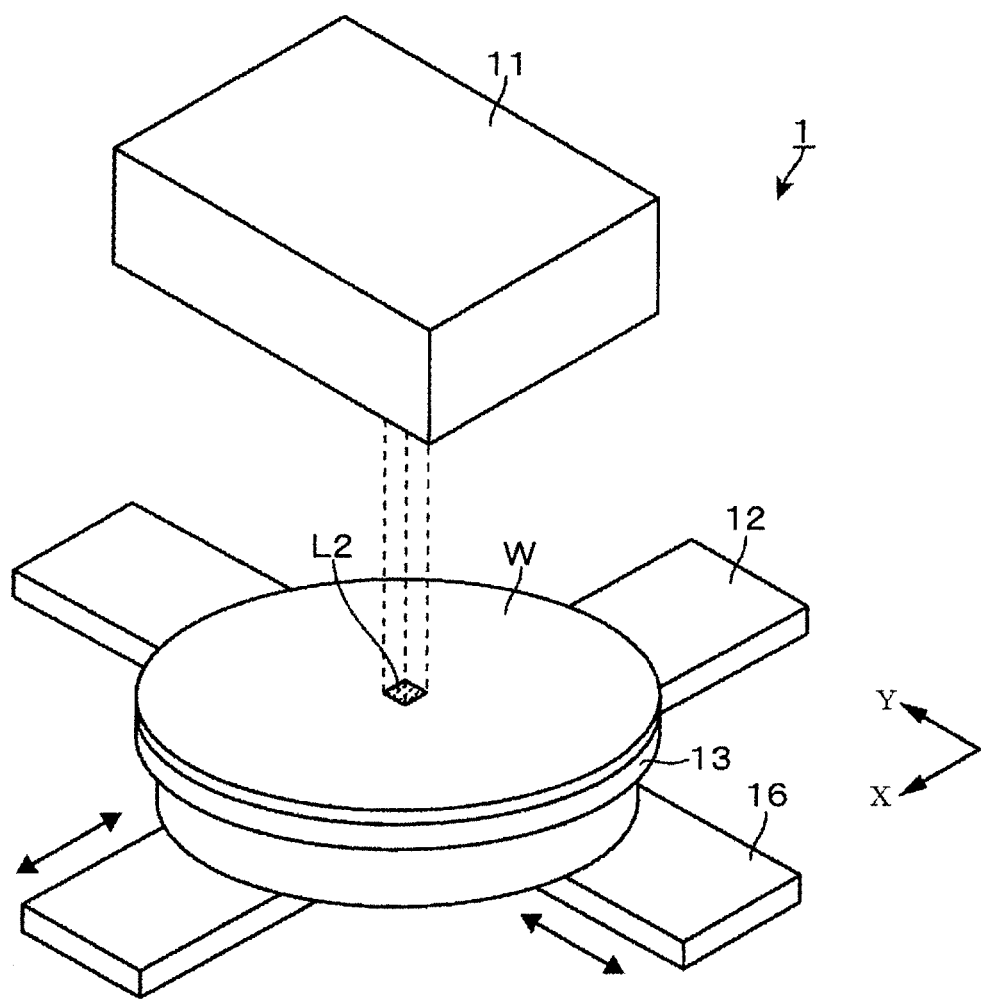
FIG. 12 is a schematic perspective view of a flood exposure apparatus according to a third embodiment of the present invention.
Figure 14:
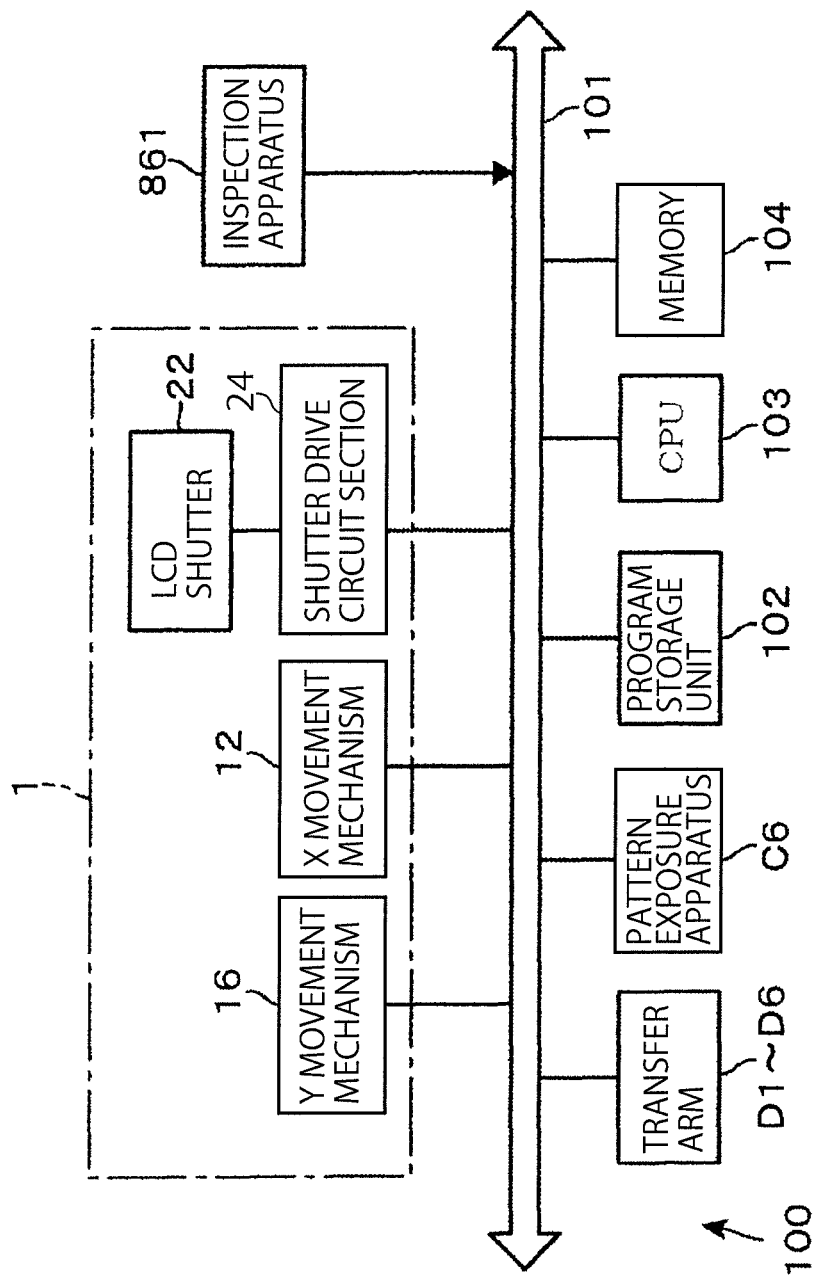
FIG. 14 is a diagram illustrating a control mechanism in the flood exposure apparatus according to the third embodiment.

In particular, as shown in FIG. 12, in the flood exposure apparatus 1 according to the third embodiment, the stage 13 is configured to be movable both in the X-direction and in the Y-direction by means of the X movement mechanism 12 and a Y movement mechanism 16. Further, the coating/developing apparatus 8 includes a controller 100 as shown in FIG. 14.

In flood exposure according to this embodiment, a light irradiation area is formed as an area corresponding to an exposure shot area formed during pattern exposure performed in the pattern exposure apparatus C6. In pattern exposure performed in the pattern exposure apparatus C6, a shot area (irradiation area), having a size corresponding to one chip on a wafer, is moved sequentially onto chips in a pulsed manner (intermittently). For example, the wafer is moved intermittently with respect to the shot area each time by a one-chip distance, and exposure is performed during stoppage of the wafer. In some cases, n (n is an integer greater than or equal to 2) shot areas, each having a size corresponding to one chip, are formed, and the wafer is moved intermittently each time by an n-chip distance. n chips are exposed simultaneously during stoppage of the wafer.

Figure 13:
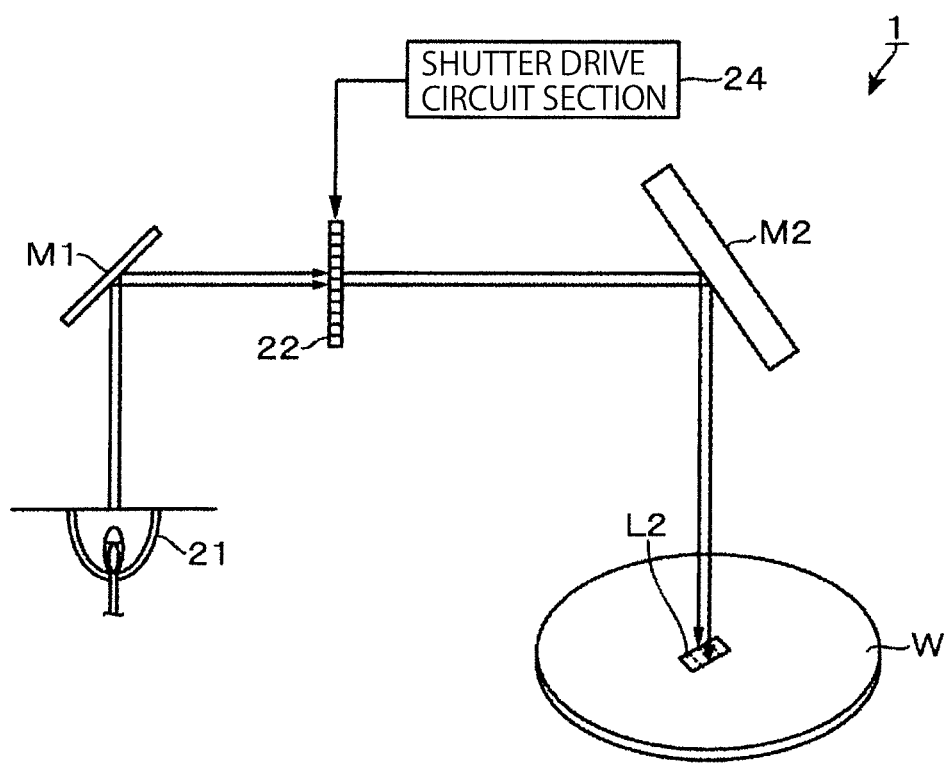
FIG. 13 is a diagram illustrating irradiation of a wafer with light emitted from a light source in the flood exposure apparatus according to the third embodiment.

Thus, in the flood exposure apparatus 1, the irradiation area L2 shown in FIG. 13 is formed as the same area as the shot area(s) (one-chip shot area or n-chip shot areas) used in the preceding pattern exposure. A method to regulate the irradiation area L2 is to use a movable light-blocking shutter capable of arbitrarily changing its horizontal and vertical size. It is also possible to use a method which involves turning off pixels of the LCD shutter 22 or a MEMS shutter, other than pixels contained in an area corresponding to the irradiation area L2, thereby regulating the light transmission area. Alternatively, as in the first embodiment, it is possible to use a mask having an opening corresponding to the irradiation area L2. A program in the controller 100 includes steps to perform a process for forming the irradiation area L2 and a process for adjusting the exposure amount during flood exposure of a wafer W.

The operation of this embodiment will now be described. First, as in the first embodiment, pattern exposure of a test wafer is performed in the pattern exposure apparatus C6. Subsequently, the test wafer is transported into the flood exposure apparatus 1, where stepwise sequential exposure of the test wafer with the irradiation area L2 e.g. at a reference exposure amount is performed in the order of exposure of pattern exposure areas (stepwise exposure areas or shot areas) employed in the pattern exposure apparatus C6.

Subsequently, the test wafer is subjected to heating treatment and development to form a resist pattern. The line width of the resist pattern is inspected by the inspection apparatus 861 (862). The processing recipe, the pattern mask and the type of the resist used for the test wafer are the same as those to be used for product wafers. Based on the inspection results, the controller 100 of the flood exposure apparatus 1 generates data on a correlation between the position (X, Y-direction position) of each chip and information on a normalized exposure amount value for the chip, and stores the data in the memory 104. Further, the controller 100 retrieves data on the order of movement of an irradiation area and the timing of movement of the irradiation area in the pattern exposure apparatus C6, and stores the data in the memory 104.

Next, wafers in a lot are sequentially subjected to resist coating and subsequent pattern exposure in the pattern exposure apparatus C6 as described above with reference to FIGS. 1 and 2. Thereafter, the wafers are sequentially transported into the flood exposure apparatus 1. The operation of the flood exposure apparatus 1 will now be described with reference to FIG. 15. First, the position of a wafer W is adjusted by means of the X movement mechanism 12 and the Y movement mechanism 16 so that the irradiation area L2, which is being irradiated with light from the light source 21, comes to lie at one end P of the wafer W. As described above, the irradiation area L2 corresponds to the entire one-step exposure area in the preceding pattern exposure. Though the irradiation area L2 is set as an irradiation area having the same size as the shot area employed in the pattern exposure, the irradiation area L2 differs from the irradiation area used in the pattern exposure in that no pattern mask is used.

Figure 15:
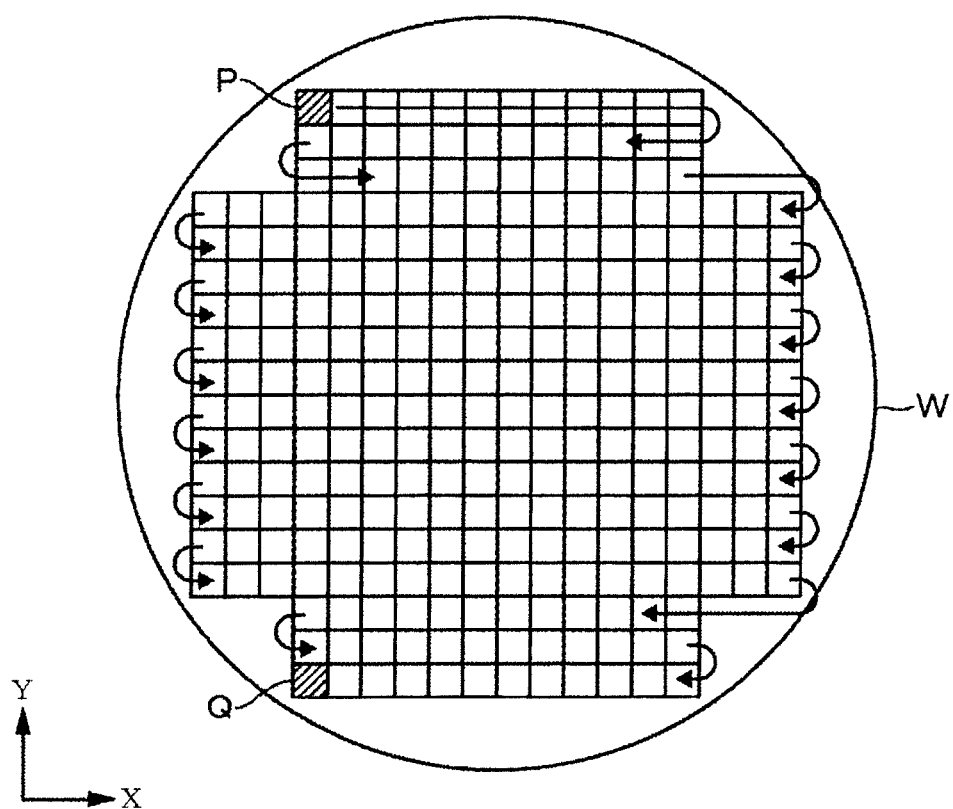
FIG. 15 is a diagram illustrating movement of an irradiation area in the flood exposure apparatus according to the third embodiment.

FIG. 15 shows exemplary movement of the irradiation area L2 in flood exposure in the case where a shot area has moved intermittently with respect to a wafer W during pattern exposure. In flood exposure, as in pattern exposure, the irradiation area L2 moves intermittently on chips from one end P to another end Q as shown by the arrows, thereby exposing chips e.g. in a one-by-one manner. If the irradiation area L2 is taken as a projection area of an exposure section 11-side light irradiation area, it can be said that the irradiation area L2 is exposed only when it is stationary on a chip(s). If the irradiation area L2 is taken as an area on a wafer W toward which light is being emitted from the exposure section 11, the irradiation area L2 should be formed on the wafer W only during stoppage of the wafer W. Consequently, only a chip(s) on the stationary wafer W should be exposed.

Also in this embodiment, as described previously, based on the data on a correlation between the position (X, Y-direction position) of each chip and information on a normalized exposure amount value for the chip, the exposure amount of the irradiation area L2 is adjusted depending on the position on a wafer W of the irradiation area L2 on a chip(s). A one-step (shot) exposure amount may be determined as the same (one) value for each position of the irradiation area L2 (i.e. the exposure amount is constant over the entire irradiation area L2). Alternatively, the exposure amount may be adjusted, i.e. an illuminance pattern may be formed, in the irradiation area L2 depending on the position of the irradiation area L2 e.g. by controlling on/off of pixels of the LCD shutter 22.

Figure 16:
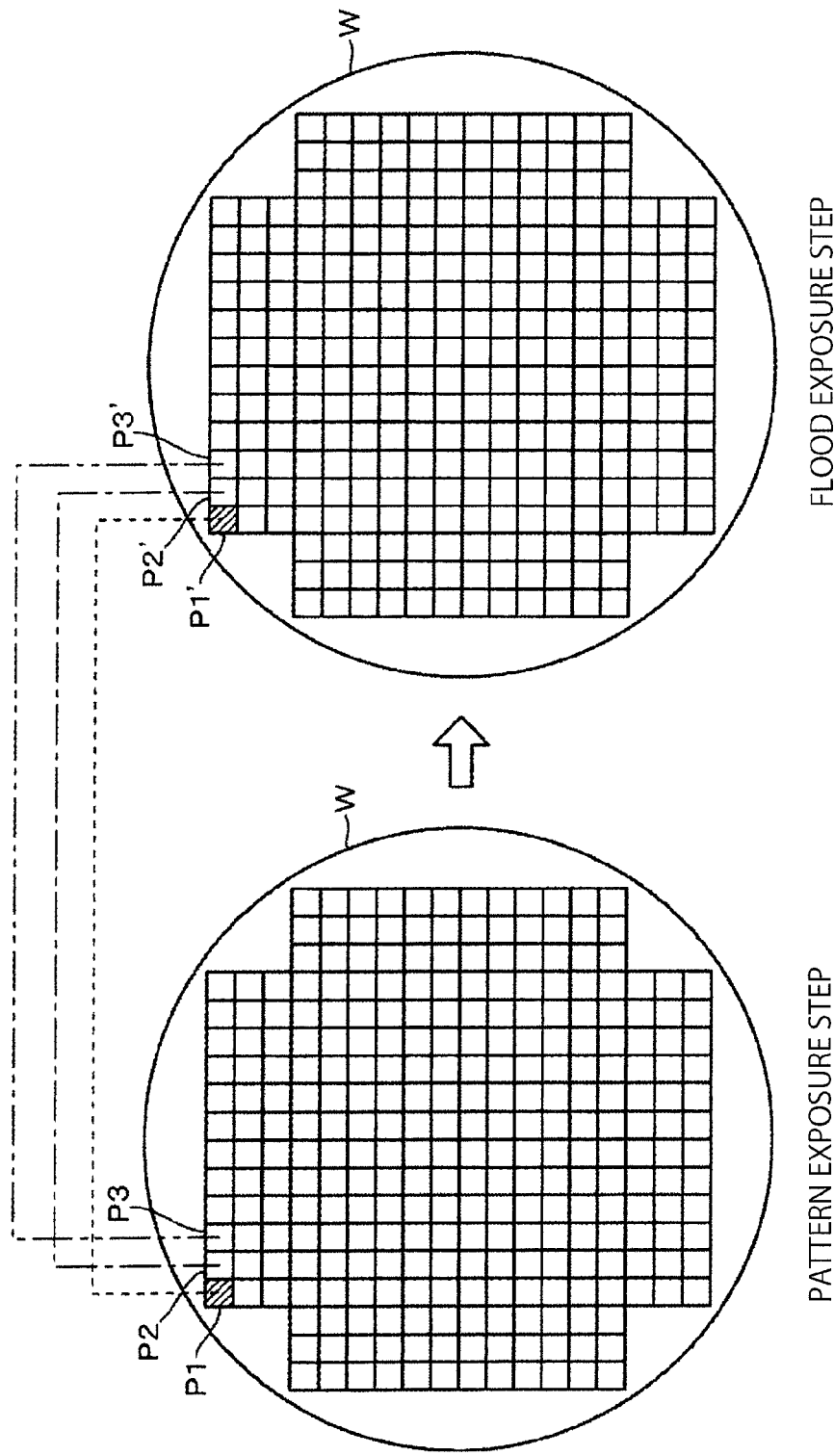
FIG. 16 is a diagram illustrating a correlation between flood exposure and pattern exposure in the third embodiment.

As shown in FIG. 16, the order (P1', P2', P3' . . . ) of shots (stepwise exposure) in flood exposure is made to coincide with the order (P1, P2, P3 . . . ) of shots in pattern exposure and, in addition, the timing of exposure shots (start times of shots subsequent to the first shot) is made to coincide with the timing of shots in pattern exposure. The directions of wafers W, when transported into the flood exposure apparatus 1, are the same e.g. with a notch as a reference. Accordingly, the time from the first shot to the start of the n-th (n is an integer) shot is equal between pattern exposure and flood exposure. This facilitates adjustment of the in-plane uniformity of pattern line width among the chips or among chip groups.

As with the first embodiment, this embodiment makes it possible to enhance the uniformity of pattern line width in the surface of a wafer W. As described previously, instead of adjusting the light intensity in the exposure section 11, it is possible to adjust the irradiation time in order to adjust the exposure amount in each shot in flood exposure. The adjustment of light intensity and the adjustment of irradiation time may be made in combination.

Figure 17:
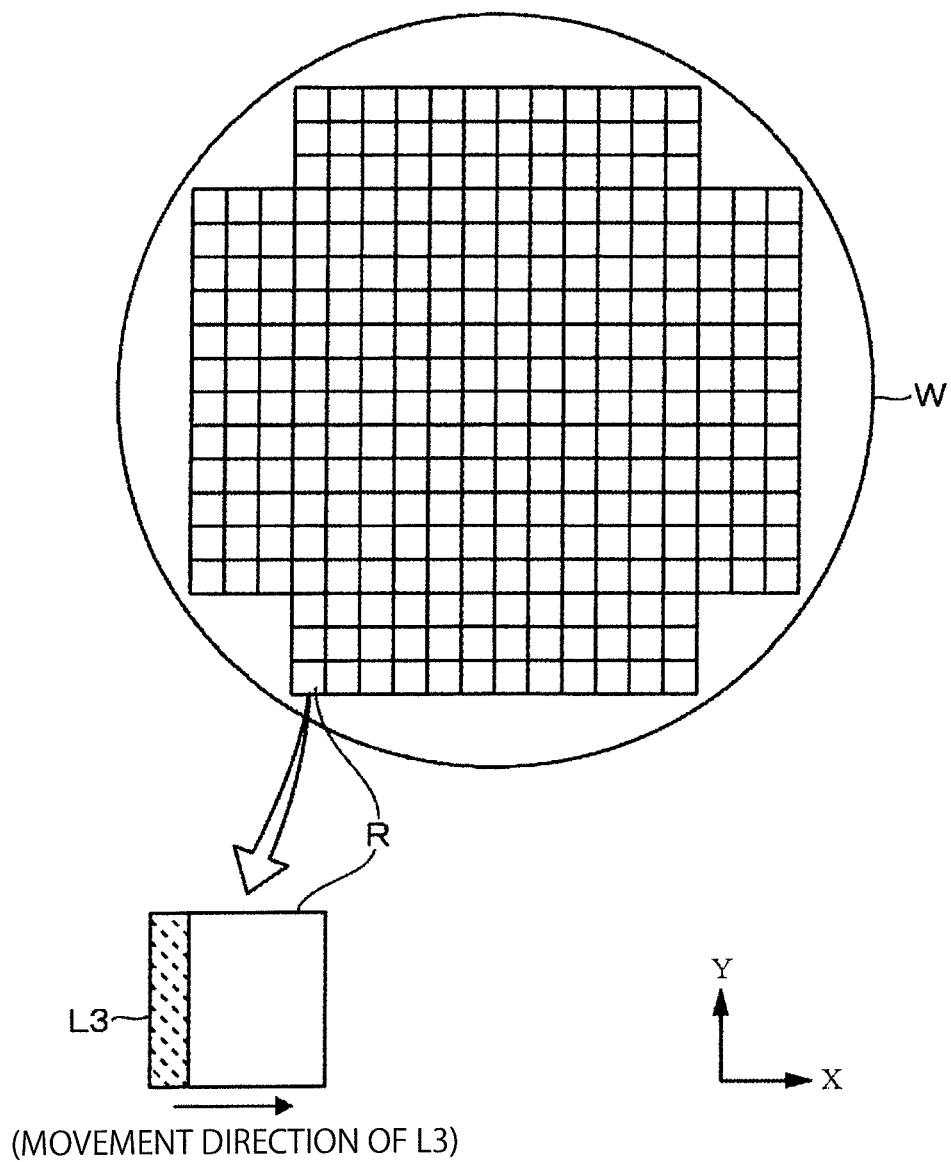
FIG. 17 is a diagram illustrating a variation of the third embodiment.

In carrying out step exposure (shot exposure) according to the third embodiment in the flood exposure apparatus 1, instead of exposing the entire one-shot area at a time, it is possible to form the irradiation area L2 by allowing an irradiation area, which is smaller than the one-shot area, to scan the shot area. FIG. 17 illustrates such an embodiment. The irradiation area L2 is moved onto chips sequentially and intermittently in the X-direction each time by a one-chip distance as in the embodiment illustrated in FIG. 15 and, in addition, a strip-shaped irradiation area L3, having a length equal to the width of one-chip area R, is moved relatively on the wafer W in the X-direction. The small strip-shaped area L3 is formed by the mask and the LCD shutter 22 as described above. The exposure amount distribution in the longitudinal direction of the irradiation area L3 may be adjusted depending on the position of the irradiation area L3. This enables fine adjustment of the exposure amount in the irradiation area L2, corresponding to one-shot area, depending on the X, Y-direction position of the irradiation area L3. It is also possible to move a strip-shaped irradiation area L3, having a length equal to the width of one chip, relatively on the wafer W in the Y-direction. Such an embodiment can be regarded as a method which involves stepwise exposure in combination with scan exposure as described above with reference to the first embodiment.

Variations According to the Present Invention

A buffer area may be provided in a transport path from the pattern exposure apparatus C6 to the flood exposure apparatus 1 so that a buffer time exists in processing of a wafer W by means of the coating/developing apparatus 8 including the flood exposure apparatus 1 of the present invention, Wafers W are not always transferred from the pattern exposure apparatus C6 to the coating/developing apparatus 8 at regular time intervals. When a wafer W is transferred after a relatively short interval, the wafer W is made to wait in the buffer area. This can make the time from the end of pattern exposure to the start of flood exposure equal among wafers W.

The length of the buffer time may be determined by simulating variation in the time from the start of pattern exposure to the start of PEB, and determining the buffer time based on the latest PEB start time. Such a buffer time can also make the time from the end of processing in the flood exposure apparatus 1 to the start of PEB equal among wafers W.

Figure 18:
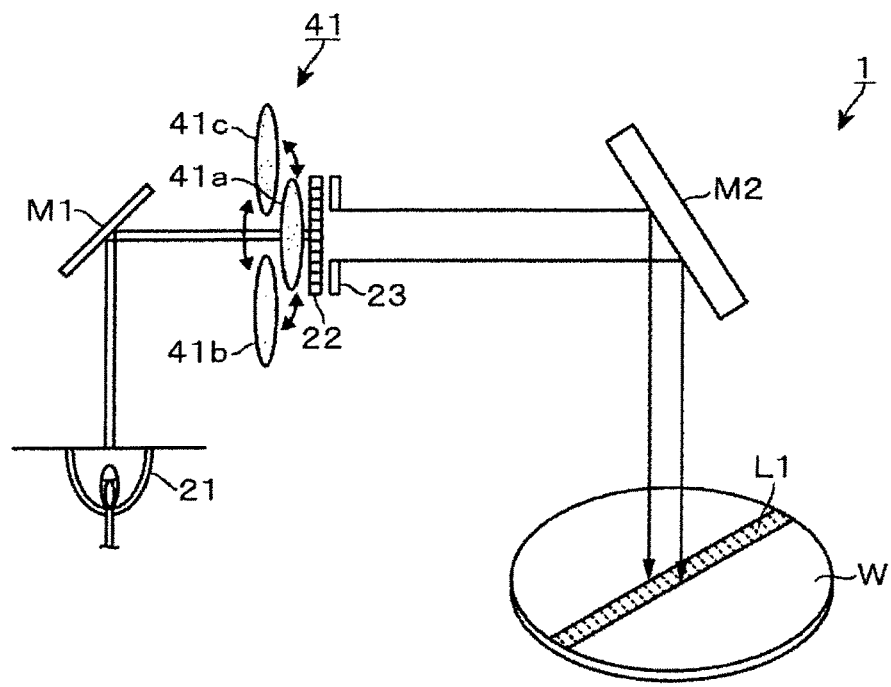
FIG. 18 is a diagram illustrating wavelength switching performed by means of a polarizing filter in a flood exposure apparatus according to the present invention.

FIG. 18 shows an exemplary construction for changing the wavelength of irradiation light for use in flood exposure, depending on the type of the resist used, in the flood exposure apparatus 1 of the present invention. In this example, light from the light source 21 comprised of the Xe—Hg lamp is passed through a polarizing filter 41 (polarizing filters 41a, 41b or 41c in the example of FIG. 18) and allowed to irradiate a wafer W. The polarizing filters 41a, 41b, 41c transmit lights having different wavelengths, and are arranged e.g. along the circumferential direction of a rotating plate. An exposure wavelength to be used in flood exposure can be set by selecting a polarizing filter 41 depending on the type of the resist used, and positioning the selected filter on the light path.

Figure 19:
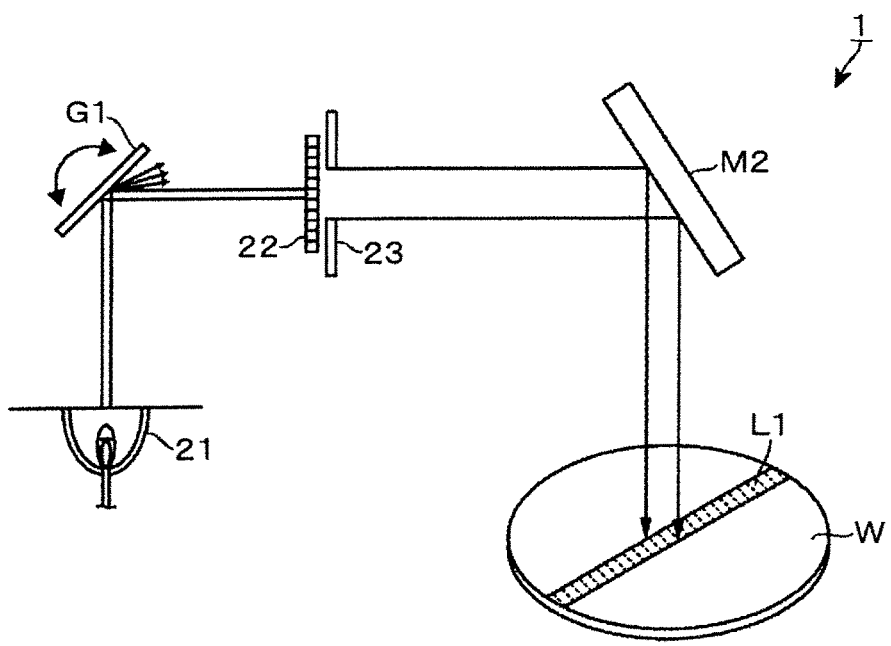
FIG. 19 is a diagram illustrating wavelength switching performed by means of a diffraction grating in a flood exposure apparatus according to the present invention.

Alternatively, the exposure wavelength of irradiation light for flood exposure may be adjusted by adjusting the angle of a diffraction grating G1 as shown in FIG. 19. In this example, the diffraction grating G1, constituting a reflecting mirror, is disposed between the light source 21 comprised of the Xe—Hg lamp and the opening of the mask 23, and the angle of the diffraction grating G1 is selected depending on the wavelength to be used, whereby light having a desired wavelength can be isolated. Light having a desired wavelength may be isolated by using a prism in place of the diffraction grating G1.

It is possible to adjust a side wall angle (SWA: the angle of inclination of a line side wall) θ by inspecting the SWA of a pattern formed on a test wafer, and adjusting the wavelength of irradiation light for use in the flood exposure apparatus 1 based on feedback of the inspection results from the inspection apparatus 861 (862). When the angle θ is smaller than a target angle $θ_0$, the wavelength of irradiation light is made longer by replacing the polarizing filter 41 or by changing the angle of the diffraction grating G1. When the angle θ is larger than the target angle $θ_0$, the wavelength of irradiation light is made shorter.

Fourth Embodiment

The fourth embodiment of the present invention differs from the first to third embodiments as follows. FIG. 20(A) schematically shows the order of processing of a wafer W in the first to third embodiments (hereinafter referred to as "preceding embodiments"). In the preceding embodiments, processing of a wafer W is performed in the following order: the formation of a resist film, pattern exposure in the pattern exposure apparatus C6, flood exposure in the flood exposure apparatus 1 (see FIG. 1) in the flood exposure module C4, heat treatment (PEB) in the processing block C3, and development.

Figure 20:
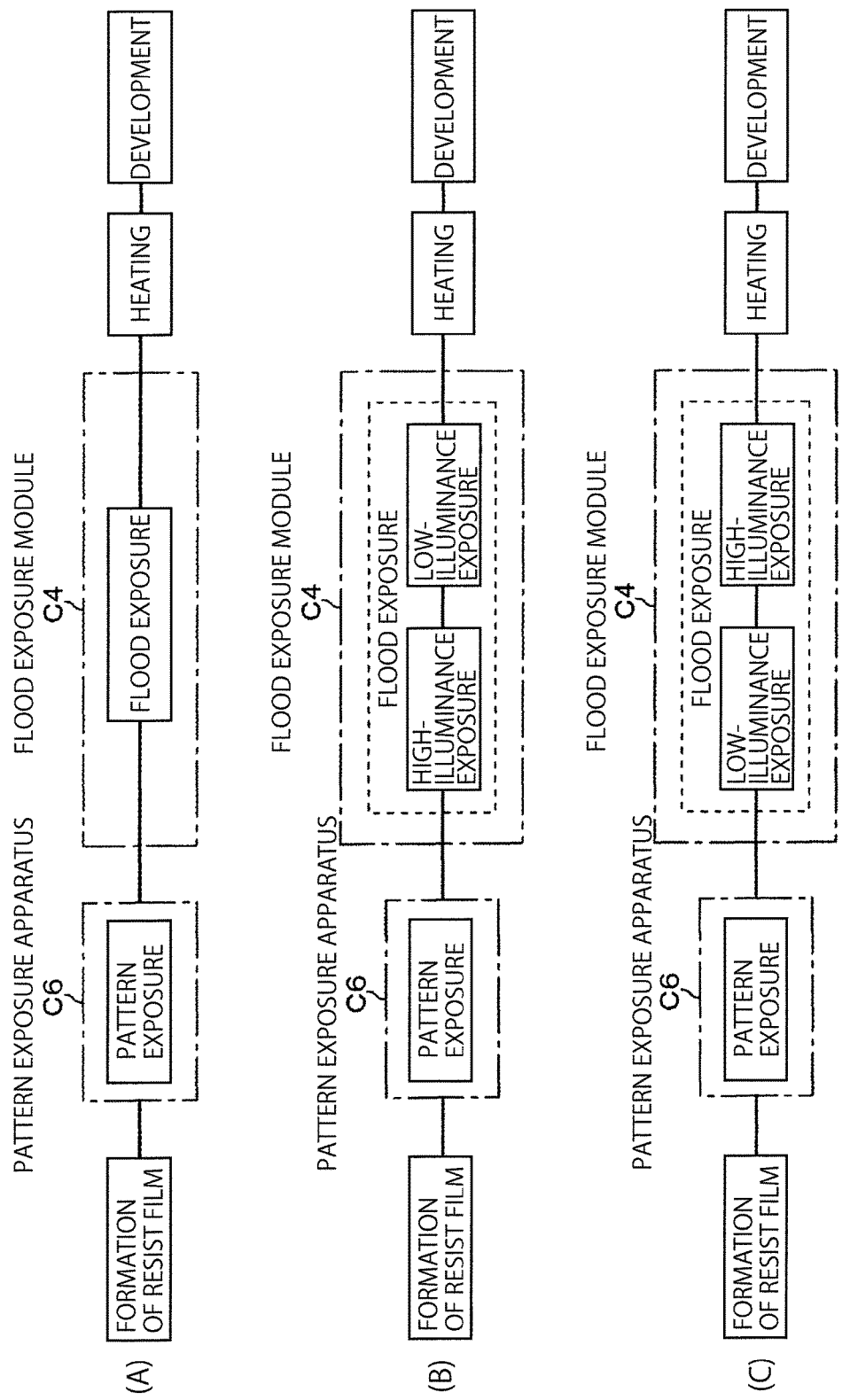
FIG. 20 is a diagram illustrating wafer processing flows in the first to fourth embodiments of the present invention.

In the fourth embodiment, on the other hand, flood exposure in the flood exposure module C4, performed after pattern exposure, is divided into high-illuminance exposure (step) as a first exposure step and low-illuminance exposure (step) as a second exposure step as shown in FIG. 20(B). The description of the temperature adjustment with a cooling plate, performed on a wafer W before flood exposure, has been omitted from FIG. 20.

The flood exposure performed in the preceding embodiments and the high-illuminance exposure and the low-illuminance exposure performed in the fourth embodiment will now be described with reference to the diagram of FIG. 21. As described previously, the flood exposure functions to correct non-uniformity in the line width of a resist pattern formed by pattern exposure and development of a resist film. In particular, for an area of a wafer where the line width of a portion insoluble in a developer is too wide (the line width of a dissolved portion is too narrow), flood exposure is performed at an increased exposure amount to increase the generation of an acid. For an area of the wafer where the line width of a portion insoluble in the developer is too narrow (the line width of a dissolved portion is too wide), flood exposure is performed at a decreased exposure amount to decrease the generation of an acid. The in-plane uniformity of pattern line width can be ensured by thus adjusting the exposure amount in flood exposure depending on the position on the wafer, i.e. the position of the pattern exposure site.

The checkers of FIG. 21 each indicate divided areas of a wafer W. One divided area actually corresponds to one chip or a plurality of chips on the wafer W; however, because of space limitations, the divided areas are simplified in a 4×4 matrix. The numerical values in the checkers indicate the exposure amounts of the divided areas, i.e. the amounts of light that irradiates the divided areas. Assuming that the divided areas are of the same size, the numerical values can indicate illuminances. The flood exposure of the preceding embodiments corresponds to FIG. 21(C). The exposure amount to be stored in the memory space of the memory shown in FIG. 6 has been described above with reference to the first embodiment. The numerical values in the checker of FIG. 21(C) indicate, for example, the exposure amounts of divided areas which are determined in the manner described above. The numerical values are schematic values, and can be taken as relative exposure amounts based on 100% exposure amount. As shown in FIG. 21(c), in the preceding embodiments, the divided areas are each exposed at an exposure amount of 99.5, 100 or 100.5 in the flood exposure apparatus 1.

On the other hand, FIGS. 21(A) and (B) correspond to the exposure amounts of the divided areas in the high-illuminance exposure (first exposure step) and the low-illuminance exposure (second exposure step), respectively, performed in the fourth embodiment. In adjusting the exposure amount in flood exposure depending on the position of the pattern exposure site, the adjustment is made only within a very narrow range. Therefore, in the fourth embodiment, the first high-illuminance exposure is performed over the entire pattern exposure area (the entire surface of the wafer W) e.g. at a constant exposure amount, and the subsequent low-illuminance exposure is performed at various exposure amounts each adjusted for each divided area of the wafer W.

The exposure amount in the high-illuminance exposure is set as follows. Of the exposure amounts of the divided areas in flood exposure for a wafer lot, a minimum exposure amount is estimated in advance, and an exposure amount which is smaller than the minimum exposure amount by a margin is set as an exposure amount in the high-illuminance exposure. Thus, the exposure amount in the low-illuminance exposure is at most about 1% of the exposure amount in the high-illuminance exposure. FIG. 21 shows that the combination of the first high-illuminance exposure performed in the manner illustrated in FIG. 21(A) and the subsequent low-illuminance exposure performed in the manner illustrated in FIG. 21(B) is comparable to the flood exposure according to the preceding embodiments, performed in the manner illustrated in FIG. 21(C).

Figure 22:
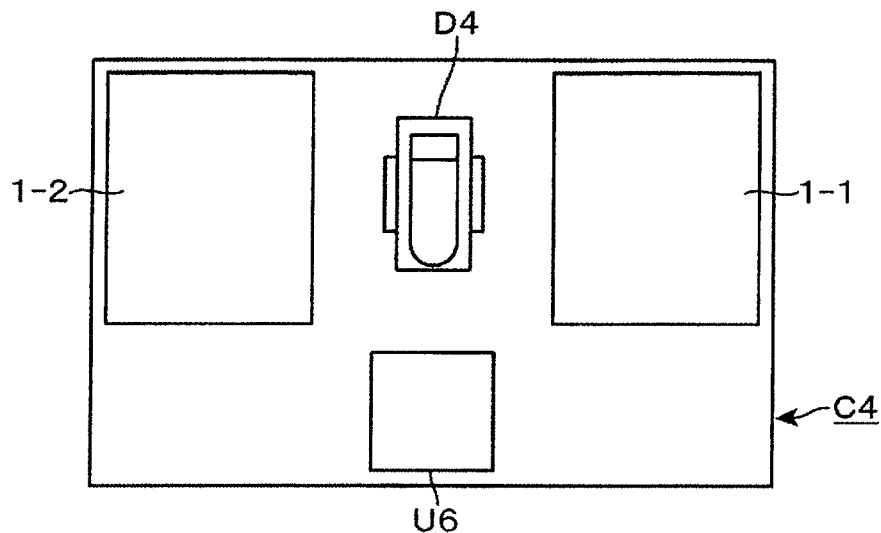
FIG. 22 is a plan view showing the construction of a flood exposure module for use in the fourth embodiment of the present invention.

FIG. 22 shows an example of the flood exposure module C4 for use in the fourth embodiment. The flood exposure module C4 includes a high-illuminance exposure unit 1-1 as a first exposure unit for performing high-illuminance exposure and a low-illuminance exposure unit 1-2 as a second exposure unit for performing low-illuminance exposure. The flood exposure module C4 also includes a transport arm D4 for transferring a wafer W between a transfer stage U6, the high-illuminance exposure unit 1-1, the low-illuminance exposure unit 1-2, and a not-shown cooling plate.

In the example of FIG. 22, the high-illuminance exposure unit 1-1 and the low-illuminance exposure unit 1-2 are each provided with a stage for placing a wafer W thereon. However, it is also possible to dispose the high-illuminance exposure unit 1-1 and the low-illuminance exposure unit 1-2 adjacent to each other, and to provide a common stage which moves between the units 1-1 and 1-2 by a movement mechanism.

The high-illuminance exposure unit 1-1 and the low-illuminance exposure unit 1-2 can each have the same construction as the flood exposure apparatus 1 for use in the preceding embodiments. The high-illuminance exposure unit 1-1 differs from the flood exposure apparatus 1 in that the unit 1-1 exposes the entire surface of a wafer W at the same exposure amount. As with the flood exposure apparatus 1, the low-illuminance exposure unit 1-2 performs adjustment of the exposure amount based on data in the memory 104; however, the low-illuminance exposure unit 1-2 differs from the flood exposure apparatus 1 in that exposure of a wafer W is performed at a small exposure amount.

Figure 7:
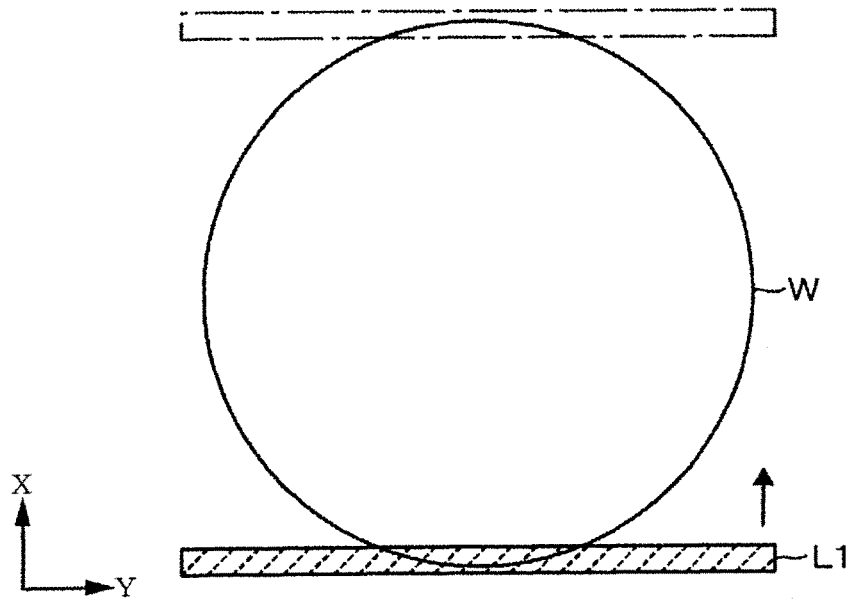
FIG. 7 is a diagram illustrating movement of an irradiation area in the flood exposure apparatus.
Figure 9:
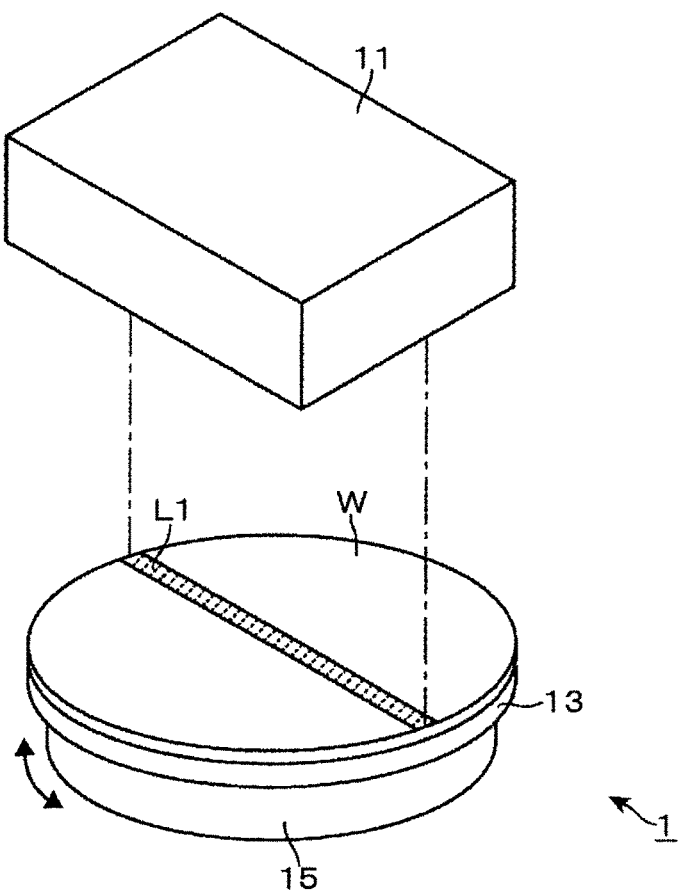
FIG. 9 is a schematic perspective view of a flood exposure apparatus according to a second embodiment of the present invention.
Figure 10:
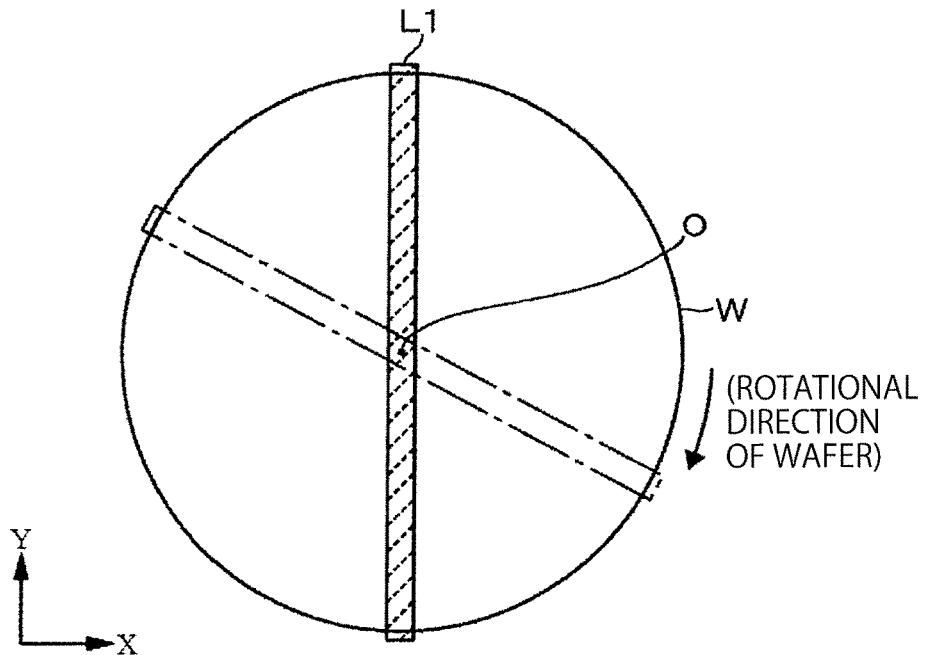
FIG. 10 is a diagram illustrating movement of an irradiation area in the flood exposure apparatus according to the second embodiment.

Thus, the high-illuminance exposure unit 1-1 exposes the entire surface of a wafer W e.g. in such a manner as to make the illuminance uniform over the entire surface of the wafer W e.g. by allowing a strip-shaped irradiation area extending in the Y-direction to scan the surface in the X-direction as shown in FIGS. 3 and 7, or by rotating a strip-shaped irradiation area relative to the wafer W as shown in FIGS. 9 and 10. The irradiation area may be allowed to scan at a constant speed and a constant exposure amount. Though the high-illuminance exposure may be performed by intermittently moving a shot area as in the first embodiment, it is preferred to employ the methods of the first and second embodiments from the viewpoint of obtaining a high throughput.

The low-illuminance exposure unit 1-2 is configured to store data on a correlation between the positions of the divided areas of a wafer W and exposure amounts, e.g. normalized exposure amount values, in the memory 104, and to adjust the exposure amount based on the data in the same manner as described above with reference to the preceding embodiments, in particular with reference to the first embodiment. The high-illuminance exposure step and the low-illuminance exposure step are not necessarily performed in this order: as shown in FIG. 20(C), the low-illuminance exposure step may be performed first, followed by the high-illuminance exposure step.

The high-illuminance exposure is not necessarily performed at a constant illuminance over the entire surface of a wafer W (over the entire pattern exposure area). For example, the high-illuminance exposure may be performed in such a manner that the illuminance increases or decreases from one end of a wafer W to the other end, or the illuminance changes locally. Further, in performing the high-illuminance exposure, the entire surface of a wafer W may be irradiated at a time without using a mask. In this case, an illuminance distribution is generally formed in the entire surface of the wafer W. However, in the low-illuminance exposure, the exposure amounts of the divided areas of the wafer W may be determined taking the illuminance distribution into consideration.

In the fourth embodiment, flood exposure, which is performed after pattern exposure and which is to supply light energy to a photosensitizer in order to generate an acid, is divided into the high-illuminance exposure and the low-illuminance exposure. The high-illuminance exposure provides most of the exposure amount necessary to generate the acid, while the low-illuminance exposure makes adjustment of the exposure amount in the surface of a wafer W based on previous information so as to reduce non-uniformity of the line width (including hole diameter, etc.) of a pattern. Such low-illuminance exposure for adjustment of the in-plane exposure amount enables an exposure amount adjustment section to use a wide adjustment range for a change in the exposure amount. The adjustment range corresponds to a combination of pixel on/off patterns in the case of the LCD shutter 22 used in the first embodiment, and to a variable range of the on/off duty ratio of a switching element of a drive current supply circuit in the case of using the light emitting diodes 211. The low-illuminance exposure therefore enables easy and highly reliable adjustment of the exposure amount in the surface of a wafer W, making it possible to obtain good in-plane uniformity of pattern line width.

Figure 23:
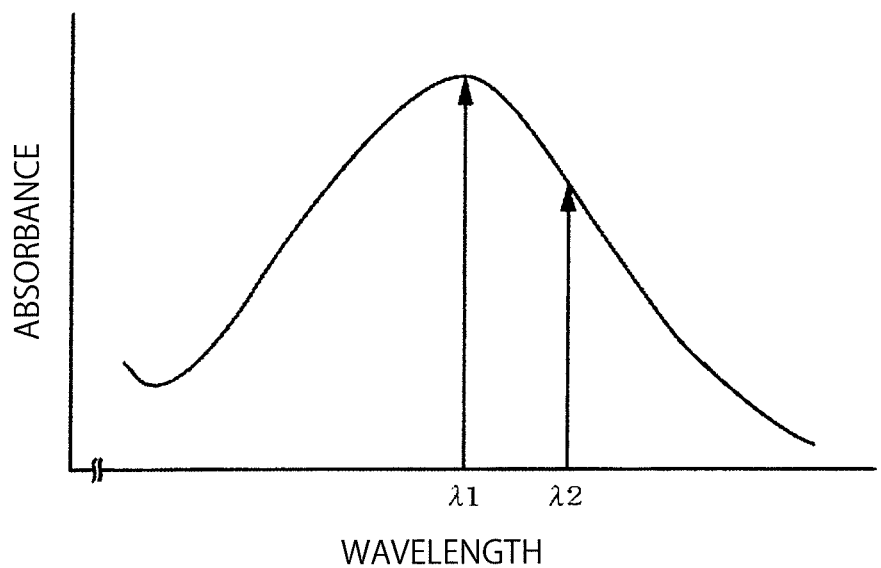
FIG. 23 is a diagram illustrating exemplary wavelengths to be used in high-illuminance exposure and low-illuminance exposure performed in the fourth embodiment of the present invention.

FIG. 23 shows a relationship between the wavelength of light and the absorbance of a resist to be coated onto a wafer W. The wavelength $\lambda 1$ that corresponds to the peak of absorbance is a wavelength at which the reaction of converting a photosensitizer, generated by pattern exposure, into an acid is activated. Both the high-illuminance exposure and the low-illuminance exposure may be performed at the wavelength $\lambda 1$, or different wavelengths may be employed in the high-illuminance exposure and the low-illuminance exposure. For example, it is possible to perform the high-illuminance exposure at the wavelength $\lambda 1$, and perform the low-illuminance exposure at a wavelength $\lambda 2$ at which the absorbance is somewhat lower than the peak value. In this case, the reaction amount of a photosensitizer with respect to the exposure amount in the low-illuminance exposure is small, i.e. the change in pattern line width is small. This can increase the adjustment range of an exposure amount adjustment section for a change in the exposure amount, thereby further facilitating adjustment of the exposure amount.

In the above-described example of the fourth embodiment, the high-illuminance exposure accounts for about 99% of the overall flood exposure. However, it is possible to perform the high-illuminance exposure e.g. in a proportion of 95%, 90% or lower of the overall flood exposure, and perform the reminder of flood exposure by the low-illuminance exposure.

In carrying out exposure of the entire surface of a wafer W according to the fourth embodiment, the high-illuminance exposure is performed to expose the entire surface at the same exposure amount (in the first exposure step), and the low-illuminance exposure is performed to expose the divided areas of the wafer W at adjusted exposure amounts (in the second exposure step). However, the present invention is not limited to such a method; for example, the first and second exposure steps may be performed at the same illuminance.

DESCRIPTION OF THE REFERENCE NUMERALS 8 coating/developing apparatus
1 flood exposure apparatus
1-1 high-illuminance exposure unit
1-2 low-illuminance exposure unit
11 exposure section
13 stage
21 light source
22 LCD shutter
23 mask
83 coating module
84 developing module
100 controller
C6 pattern exposure apparatus
L1, L2, L3 irradiation area
W wafer

The invention claimed is:

1. An exposure apparatus for exposing a pattern exposure area after performing pattern exposure on a substrate having a resist film formed thereon by using a pattern mask, said apparatus comprising:
the substrate having the resist film formed thereon;
a stage for placing the substrate thereon;
an exposure section for exposing the substrate on the stage; and
a controller for outputting, based on previously-obtained information, a control signal to adjust an exposure amount for each of a plurality of areas of the substrate,
wherein the exposure section includes a light guide plate having a plurality of control areas, arranged in the planar direction of the light guide plate, which each can be selectively switched between a light transmissive state and a light blocking state by an electrical signal, and wherein the control signal is a signal to control the state of each control area, or a signal to control the ratio between the light transmission time and the light blocking time for each control area.

2. The exposure apparatus according to claim 1, wherein said information is information on pattern line width, acquired by inspection with an inspection apparatus of a resist pattern on a substrate, obtained by heating the substrate after exposure and then developing the substrate.

3. The exposure apparatus according to claim 2, wherein the resist pattern is obtained by performing pattern exposure of a resist film on the substrate, and then performing exposure of the entire surface of the substrate, followed by heating and subsequent development of the resist film.

4. The exposure apparatus according to claim 1, wherein the controller includes a storage unit for storing data on a correlation between a position on the substrate and an exposure amount.

5. The exposure apparatus according to claim 1, wherein the irradiation area of the exposure section is set smaller than the entire resist pattern forming area of the substrate, wherein the exposure apparatus further comprises a movement mechanism for moving the irradiation area along the surface of the substrate and relative to the substrate on the stage, and wherein the controller is configured to output a control signal to adjust the exposure amount depending on the position of the irradiation area on the substrate.

6. The exposure apparatus according to claim 5, wherein the movement mechanism is configured to continuously move the irradiation area in an X-direction relative to the substrate, and wherein the irradiation area has a strip-like shape extending in a Y-direction.

7. The exposure apparatus according to claim 6, wherein the controller is configured to output a control signal to adjust the Y-direction distribution of illuminance depending on the X-direction position of the irradiation area on the substrate.

8. The exposure apparatus according to claim 6, wherein the length of the irradiation area is set equal to or longer than the maximum Y-direction size of the entire resist pattern forming area of the substrate.

9. The exposure apparatus according to claim 6, wherein the controller is configured to output a control signal to the movement mechanism for it to adjust the speed of movement of the irradiation area depending on the position of the irradiation area on the substrate.

10. An exposure apparatus for exposing a pattern exposure area after performing pattern exposure on a substrate having a resist film formed thereon by using a pattern mask, said apparatus comprising:
a stage for placing the substrate thereon;
an exposure section for exposing the substrate on the stage; and
a controller for outputting, based on previously-obtained information, a control signal to adjust an exposure amount for each of a plurality of areas of the substrate,
wherein the irradiation area of the exposure section is set smaller than the entire resist pattern forming area of the substrate, wherein the exposure apparatus further comprises a movement mechanism for moving the irradiation area along the surface of the substrate and relative to the substrate on the stage, and wherein the controller is configured to output a control signal to adjust the exposure amount depending on the position of the irradiation area on the substrate, and
wherein the irradiation area has a strip-like shape extending from a central portion toward the periphery of the substrate, and wherein the movement mechanism includes a rotating mechanism for rotating the substrate about the center of the substrate and relative to the irradiation area.

11. The exposure apparatus according to claim 10, wherein the controller is configured to output a control signal to adjust the distribution of illuminance in the longitudinal direction of the irradiation area depending on the position of the irradiation area.

12. An exposure apparatus for exposing a pattern exposure area after performing pattern exposure on a substrate having a resist film formed thereon by using a pattern mask, said apparatus comprising:
a stage for placing the substrate thereon;
an exposure section for exposing the substrate on the stage; and
a controller for outputting, based on previously-obtained information, a control signal to adjust an exposure amount for each of a plurality of areas of the substrate,
wherein the irradiation area of the exposure section is set smaller than the entire resist pattern forming area of the substrate, wherein the exposure apparatus further comprises a movement mechanism for moving the irradiation area along the surface of the substrate and relative to the substrate on the stage, and wherein the controller is configured to output a control signal to adjust the exposure amount depending on the position of the irradiation area on the substrate, and
wherein the irradiation area is set larger than a mask size used in one exposure operation in the pattern exposure, wherein the movement mechanism includes a mechanism for relatively moving the irradiation area in a radial direction of the substrate, and a mechanism for rotating the irradiation area about the center of the substrate and relative to the substrate, and wherein the controller outputs a control signal to the movement mechanism for it to perform the step of relatively moving the irradiation area in a radial direction of the substrate, and the step of rotating the irradiation area about the center of the substrate and relative to the substrate.

13. An exposure apparatus for exposing a pattern exposure area after performing pattern exposure on a substrate having a resist film formed thereon by using a pattern mask, said apparatus comprising:
a stage for placing the substrate thereon;
an exposure section for exposing the substrate on the stage; and
a controller for outputting, based on previously-obtained information, a control signal to adjust an exposure amount for each of a plurality of areas of the substrate,
wherein the irradiation area of the exposure section is set smaller than the entire resist pattern forming area of the substrate, wherein the exposure apparatus further comprises a movement mechanism for moving the irradiation area along the surface of the substrate and relative to the substrate on the stage, and wherein the controller is configured to output a control signal to adjust the exposure amount depending on the position of the irradiation area on the substrate, and
wherein the size of the irradiation area is set equal to the integral multiple of a size corresponding to a mask size used in one exposure operation in the pattern exposure, wherein the movement mechanism is configured to intermittently move the irradiation area relative to the substrate in such a manner that the irradiation area sequentially stops in areas which have undergone the pattern exposure, and wherein the controller outputs a control signal to perform exposure only when the irradiation area remains stationary with respect to the substrate.

14. The exposure apparatus according to claim 13, wherein the controller outputs a control signal to intermittently move the irradiation area relative to the substrate in an order corresponding to the order of exposure in the pattern exposure.

15. The exposure apparatus according to claim 13, wherein the controller is configured to output a control signal to adjust the exposure amount depending on the X, Y-direction position of the irradiation area on the substrate.

16. The exposure apparatus according to claim 13, wherein the controller is configured to output a control signal to adjust the distribution of illuminance in the irradiation area depending on the position of the irradiation area on the substrate.

17. A resist pattern forming method comprising the steps of:
performing pattern exposure of a resist film, which has been formed on a substrate using a resist by using a pattern mask;
determining an exposure amount for each of a plurality of areas of the substrate based on previously-obtained information;
subsequently exposing a pattern exposure area of the substrate based on the exposure amount determined in the preceding step;
subsequently heating the substrate; and
subsequently developing the substrate,
wherein the step of performing exposure based on the exposure amount determined in the preceding step includes a step of moving an irradiation area, which is set smaller than the entire resist pattern forming area of the substrate, along the surface of the substrate and relative to the substrate, and a step of adjusting the exposure amount depending on the position of the irradiation area on the substrate, and wherein the step of moving the irradiation area along the surface of the substrate and relative to the substrate is the step of rotating the substrate about the center of the substrate and relative to the irradiation area.

18. The resist pattern forming method according to claim 17, wherein the step of moving the irradiation area along the surface of the substrate and relative to the substrate further includes the step of moving the irradiation area in a radial direction of the substrate.

19. The resist pattern forming method according to claim 17, further comprising the step of adjusting the speed of movement of the irradiation area in order to adjust the exposure amount depending on the position of the irradiation area.

20. The resist pattern forming method according to claim 17, wherein the step of exposing the pattern exposure area of the substrate is the step of exposing the entire resist pattern forming area of the substrate at a time.

21. The resist pattern forming method according to claim 17, wherein an exposure wavelength to be used in the step of exposing the pattern exposure area is selected based on information on the angle of a side wall of a resist pattern, acquired by inspection with an inspection apparatus of the resist pattern on a substrate, obtained by heating the substrate after exposure and then developing the substrate.

22. A non-transitory storage medium storing a computer program for use in an apparatus for exposing a substrate, having a resist film formed thereon, after pattern exposure of the substrate, said computer program including steps for causing the apparatus to perform the resist pattern forming method according to claim 17.

* * * * *